US008527823B2

(12) United States Patent
Whetsel

(10) Patent No.: US 8,527,823 B2
(45) Date of Patent: Sep. 3, 2013

(54) GATING OF CLOCK-DR AND PAUSE-DR FROM TAP TO TCA

(71) Applicant: Texas Instruments Incorporated, Dallas, TX (US)

(72) Inventor: Lee D. Whetsel, Parker, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 13/676,344

(22) Filed: Nov. 14, 2012

(65) Prior Publication Data

US 2013/0073915 A1 Mar. 21, 2013

Related U.S. Application Data

(62) Division of application No. 13/330,788, filed on Dec. 20, 2011, now Pat. No. 8,335,953, which is a division of application No. 12/795,364, filed on Jun. 7, 2010, now Pat. No. 8,108,742.

(60) Provisional application No. 61/186,115, filed on Jun. 11, 2009.

(51) Int. Cl.
*G01R 31/28* (2006.01)

(52) U.S. Cl.
USPC .......................................... 714/727; 714/732

(58) Field of Classification Search
USPC ................. 714/724, 726, 727, 729, 731, 732, 714/733, 734
See application file for complete search history.

(56) References Cited

U.S. PATENT DOCUMENTS

| 7,143,324 | B2 * | 11/2006 | Bratt et al. ..................... 714/726 |
| 7,278,123 | B2 * | 10/2007 | Ravi et al. ...................... 714/738 |
| 7,353,470 | B2 * | 4/2008 | Cooke et al. .................. 716/136 |
| 7,461,309 | B2 * | 12/2008 | Kiryu ............................. 714/729 |
| 7,487,419 | B2 * | 2/2009 | Mukherjee et al. ........... 714/729 |
| 7,797,603 | B2 * | 9/2010 | Rajski et al. .................. 714/738 |
| 7,913,137 | B2 * | 3/2011 | Mukherjee et al. ........... 714/729 |

OTHER PUBLICATIONS

Hatami, S.; Alisafaee, M.; Atoofian, E.; Navabi, Z.; Afzali-Kusha, A.;, "A low-power scan-path architecture," Circuits and Systems, 2005. ISCAS 2005. IEEE International Symposium on, vol., no., pp. 5278-5281 vol. 5, May 23-26, 2005.*

Furukawa, H.; Wen, X.; Miyase, K.; Yamato, Y.; Kajihara, S.; Girard, P.; Wang, L.-T.; Tehranipoor, M.;, "CTX: A Clock-Gating-Based Test Relaxation and X-Filling Scheme for Reducing Yield Loss Risk in At-Speed Scan Testing," Asian Test Symposium, 2008. ATS '08. 17th, vol., no., pp. 397-402, Nov. 24-27, 2008.*

Chandra, A.; Chakrabarty, K.;, "A unified approach to reduce SOC test data volume, scan power and testing time," Computer-Aided Design of Integrated Circuits and Systems, IEEE Transactions on, vol. 22, No. 3, pp. 352-363, Mar. 2003.*

* cited by examiner

*Primary Examiner* — Cynthia Britt

(74) *Attorney, Agent, or Firm* — Lawrence J. Bassuk; W. James Brady; Frederick J. Telecky, Jr.

(57) ABSTRACT

The disclosure describes novel methods and apparatuses for controlling a device's TCA circuit when the device exists in a JTAG daisy-chain arrangement with other devices. The methods and apparatuses allow the TCA test pattern set used during device manufacturing to be reused when the device is placed in a JTAG daisy-chain arrangement with other devices, such as in a customers system using the device. Additional embodiments are also provided and described in the disclosure.

5 Claims, 28 Drawing Sheets

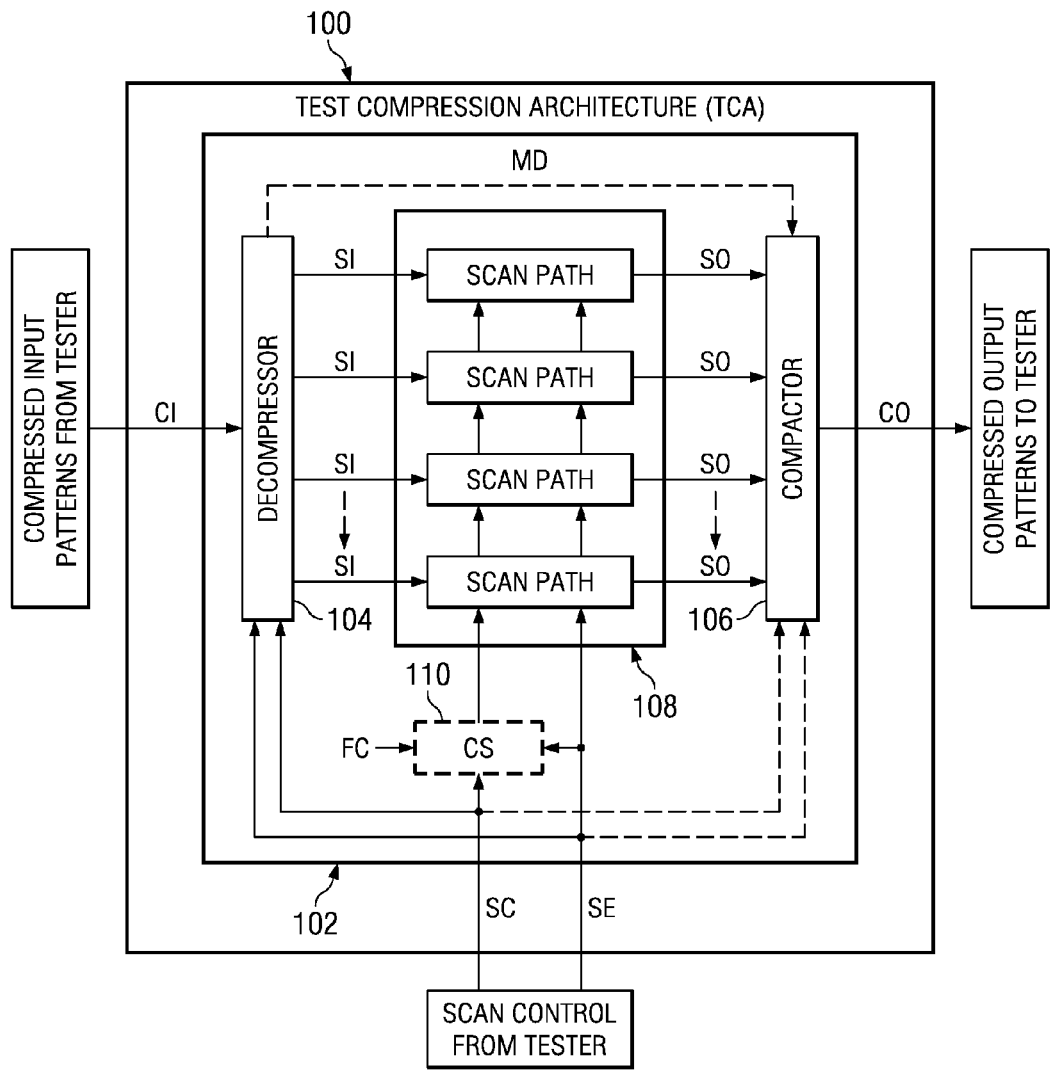
FIG. 1 *(PRIOR ART)*
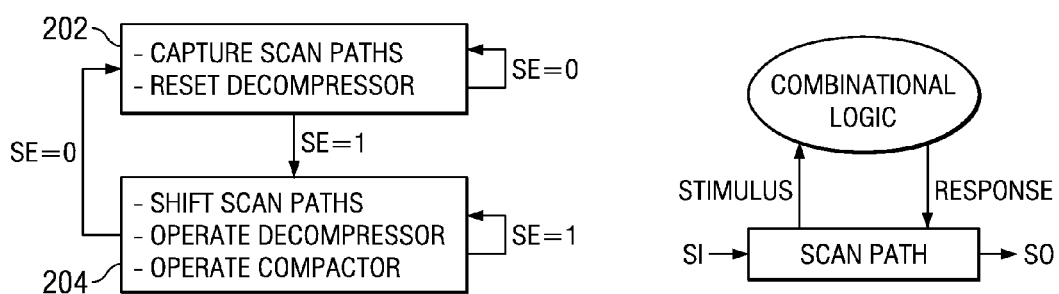
FIG. 2 *(PRIOR ART)*
FIG. 3 *(PRIOR ART)*

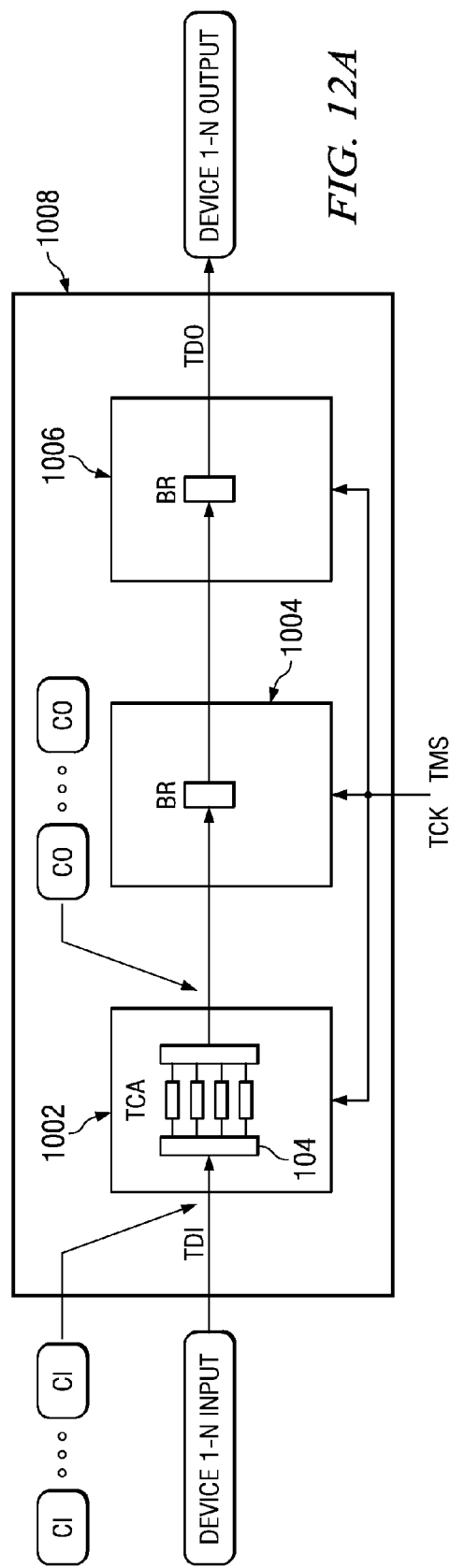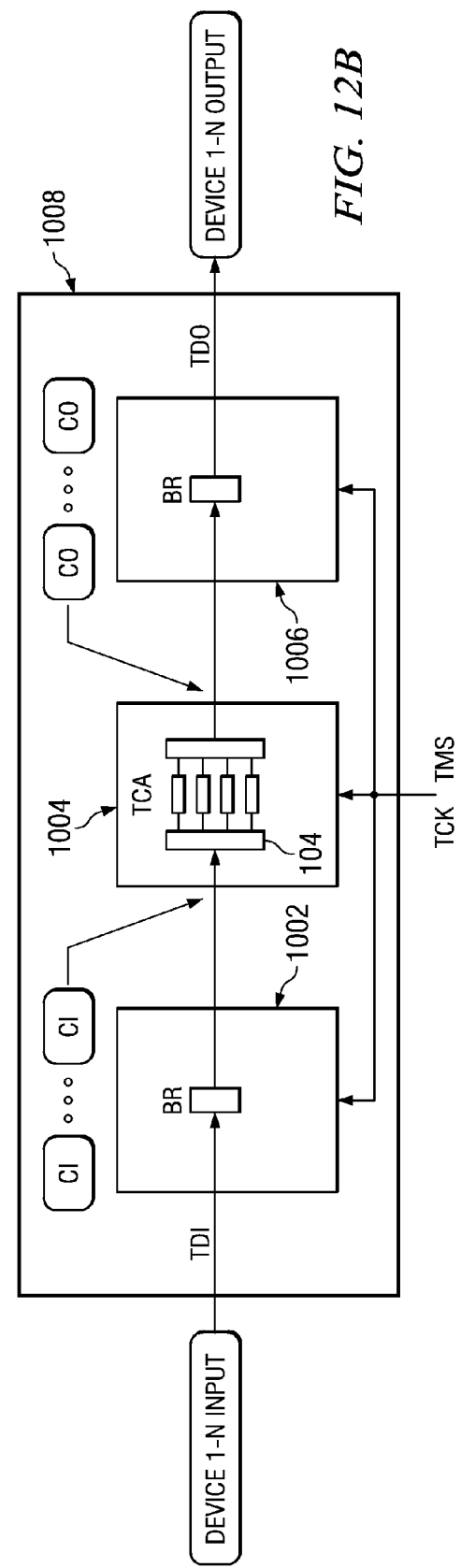

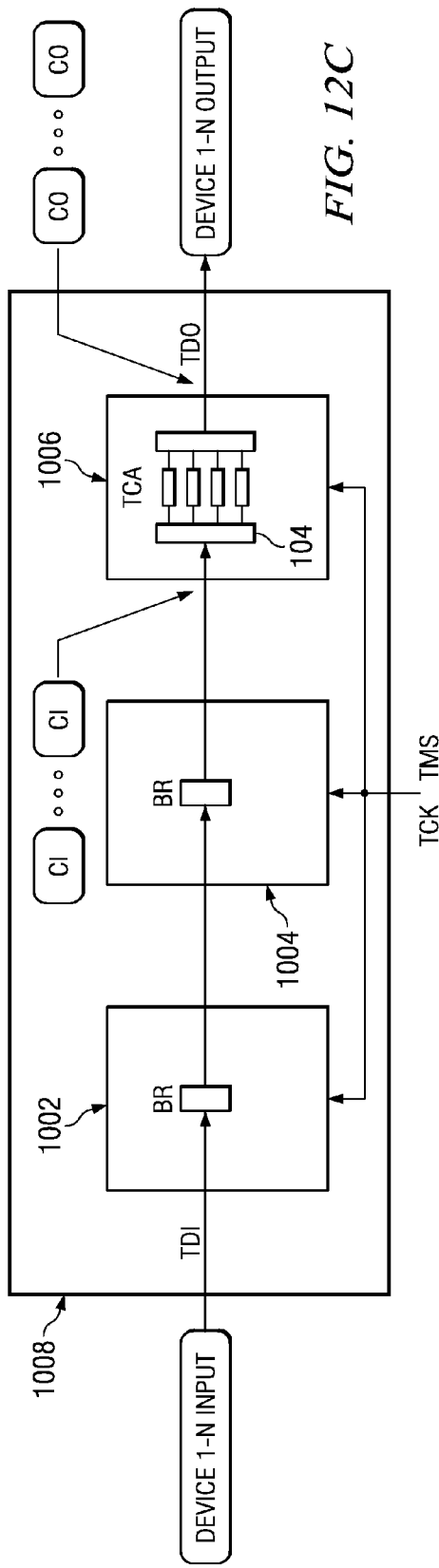
FIG. 12C
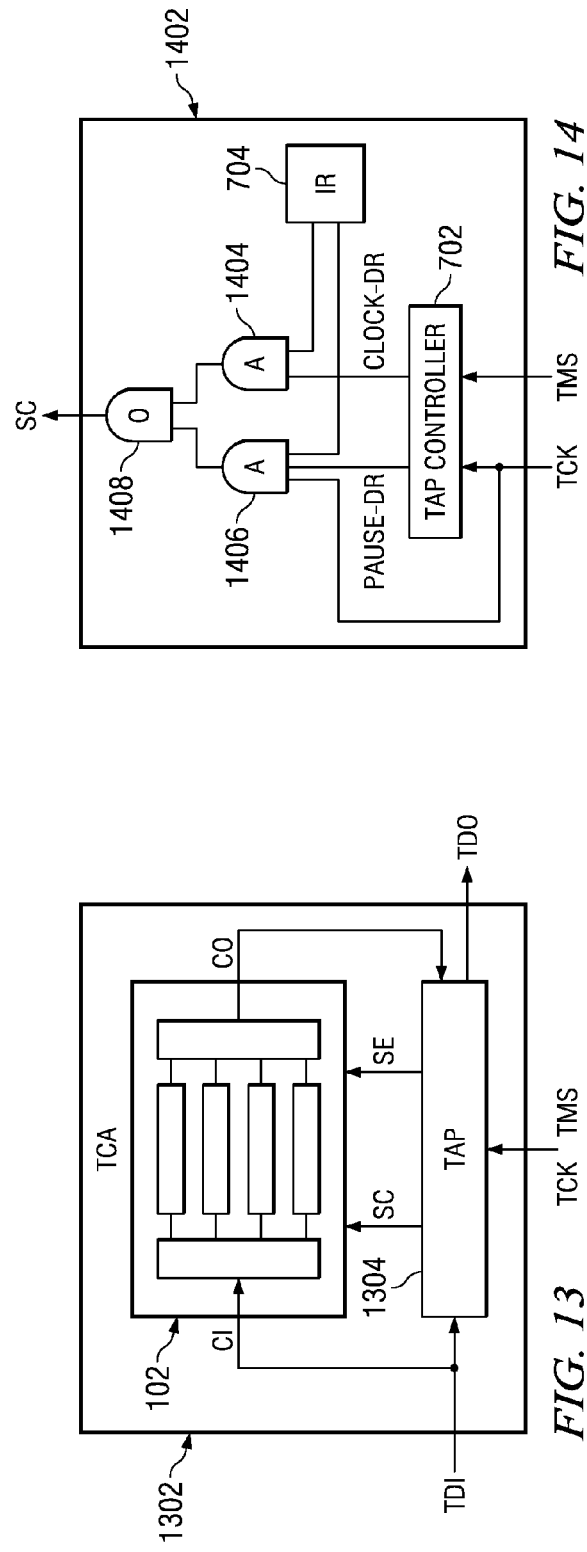
FIG. 14
FIG. 13

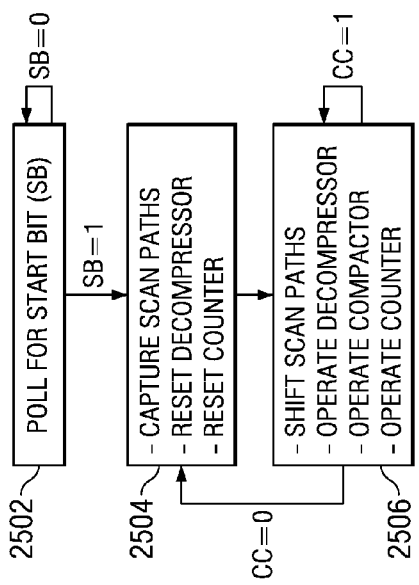
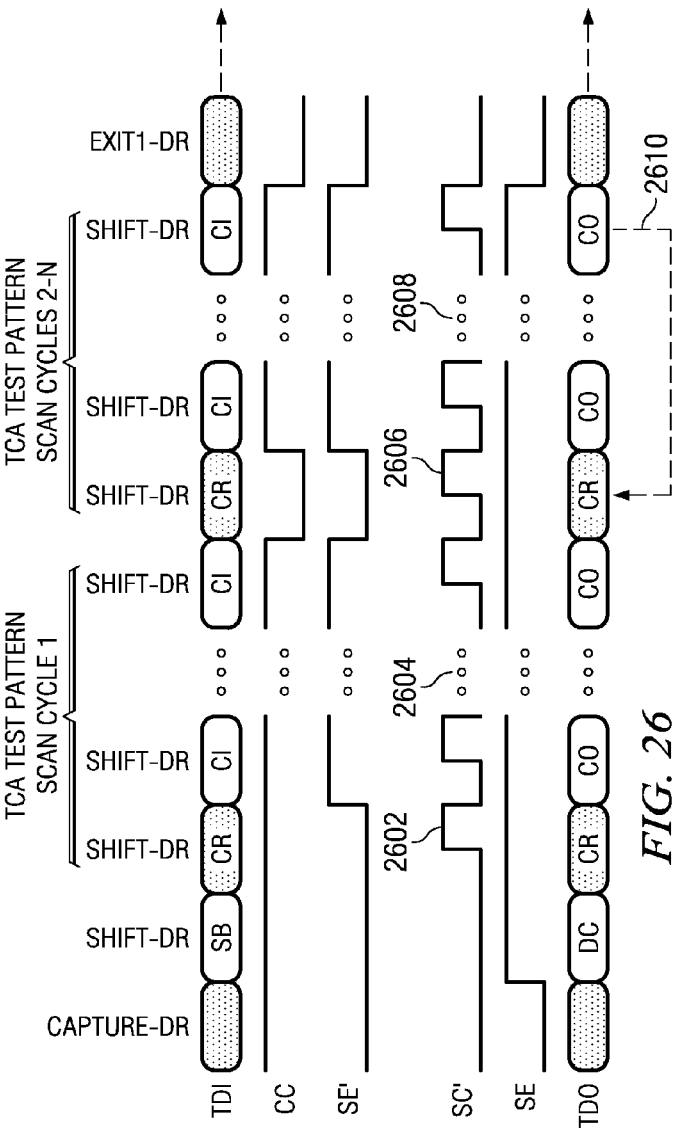
FIG. 25
FIG. 26

GATING OF CLOCK-DR AND PAUSE-DR FROM TAP TO TCA

This application is a divisional of application Ser. No. 13/330,788, filed Dec. 20, 2011, now U.S. Pat. No. 8,335,953, issued Dec. 18, 2012;

Which is a divisional of application Ser. No. 12/795,364, filed Jun. 7, 2010, now U.S. Pat. No. 8,108,742, granted Jan. 31, 2012

Which claims priority from Provisional Application No. 61/186,115, filed Jun. 11, 2009.

FIELD OF THE DISCLOSURE

This disclosure relates generally to test compression architectures in electrical devices and in particular to accessing test compression architectures in a daisy-chained JTAG environment.

BACKGROUND OF THE DISCLOSURE

A growing number of electrical devices, which may be ICs or embedded cores within ICs, are being tested using test compression architectures (TCA), such as Mentor's TestKompress™ embedded deterministic test technology, incorporated herein by reference. Fundamentally a TCA consists of three elements, a decompressor circuit, a parallel scan path arrangement, and a compactor circuit. The decompressor circuit receives compressed input data from one or more inputs from a tester, decompresses the compressed input data into parallel stimulus patterns that are input to parallel scan paths. The compactor circuit receives parallel response patterns that are output from the parallel scan paths, compacts the response patterns down to one or more compressed data outputs that are input to the tester. A first advantage of TCAs is that they allow a large number of shorter length parallel scan paths to be accessed using only a small number of compressed data inputs and compressed data outputs. A second advantage of TCAs is that they reduce the amount of test data that needs to be transmitted between the tester and device under test, since the test data is compressed. Today device TCAs must be accessed for testing by connecting the device TCA interface directly to a tester. The present disclosure provides methods and apparatuses for allowing a device TCA to be accessed for testing when the device is not connected directly to a tester but rather exists in a serial path containing other devices.

FIG. 1 illustrates an example of device 100 containing a test compression architecture (TCA) 102. The TCA 102 is interfaced to an external tester via a compressed data input (CI), a compressed data output (CO), a scan clock (SC) input, and a scan enable (SE) input. While TCAs may have more than one CI input and more than one CO output, this disclosure focuses on TCAs that use a single CI input and a single CO output. The TCA 102 comprises a decompressor 104, a compactor 106, and parallel scan paths 108. The TCA 102 may also include a clock selector (CS) 110 to allow the parallel scan paths to be clocked by the devices functional clock (FC) at times when the parallel scan paths are capturing response data. The decompressor has inputs coupled to the CI, SC and SE inputs and outputs coupled to the scan inputs (SI) of the parallel scan paths 108. The compactor has inputs coupled to the scan outputs (SO) of parallel scan paths 108 and an output coupled to the CO output. The parallel scan paths 108, in addition to the SI inputs and SO outputs, have inputs coupled to the SC and SE inputs, inputs coupled to response outputs from combinational logic, and outputs coupled to stimulus inputs to combinational logic, as shown in FIG. 3. If the CS 110 is used, the SE input will control it to pass the SC signal to the parallel scan paths 108 during shift operations and to pass the FC signal to the parallel scan paths 108 during capture operations.

FIG. 2 illustrates the operational states 202 and 204 of the TCA during test. In state 202 when the SE input is low and an SC input occurs the parallel scan paths capture response data from the combinational logic and the decompressor is reset to a known state. If CS 110 is used, the logic low on SE will select the FC signal to clock the parallel scan paths in state 202. In state 204 when the SE input is high and SC inputs occur the decompressor 104 decompresses the data input on CI into parallel scan inputs (SI) that are shifted into the parallel scan paths, and the compactor 106 inputs and compacts the parallel scan outputs (SO) from the parallel scan paths into a single output which is output on CO. If CS 110 is used, the logic high on SE will select the SC signal to clock the parallel scan paths in state 204. The TCA will remain in state 204 until the compressed input to the parallel scan paths and the compressed output from the scan paths is complete. As can be seen the capture and shift operation states of the TCA is similar to the capture and shift operation states of conventional scan paths, with the exception that the TCA includes the additional operations of decompressing the data input on CI to produce the scan inputs (SI) to the parallel scan paths and compressing the scan outputs (SO) from the parallel scan paths into a compressed form that can be output on CO.

While the example of FIG. 2 shows SE being low in state 202 and high in state 204, the logic levels of SE for these states could be reversed if desire.

Most known decompressors 104 utilize a linear feedback state machine (LFSM) in conjunction with a phase shifter circuit to produce the output patterns that are applied to the SI inputs of the parallel scan paths 108. In the referenced Mentor TestKompress™ technology, the LFSM is referred to as a ring generator which is a particular type of linear feedback shift register. The ring generator receives the CI data and, in response, produces pseudo random input patterns to the phase shifter. The phase shifter responds to the pseudo random input patterns to output stimulus input (SI) patterns to the parallel scan paths. The CI input modifies the output patterns from the ring generator to allow the phase shifter to produce the desired stimulus pattern input to the parallel scan paths.

Most known compactors 106 utilize XOR gating trees that input the scan outputs (SO) from the parallel scan paths and compress them, via XOR gating, into a single compacted signal that can be output on CO. While simple compactors may only use XOR gating trees, more sophisticated compactors, such as the compactor used the reference Mentor TestKompress™ technology, may use XOR gating trees in combination with masking circuitry to allow masking off unknown scan outputs (SO) from the parallel scan path scan to prevent the unknown scan outputs from corrupting the compacted signal output on CO. If the compactor contains masking circuitry it can receive masking data (MD) from the decompressor 104 and control from SC and SE to load the masking data, as shown in dotted line in FIG. 1.

FIG. 4 illustrates an example of a device 402 with a TCA 102 being directly connected to an external tester 404 via the CI, SC, SE and CO TCA interface signals to allow TCA test patterns to be applied to the device. This example is typical of how the device manufacturer would test the device.

FIG. 5 illustrates the tester 404 of FIG. 4 operating the SC and SE signals to perform a TCA scan cycle. The scan cycle includes a capture operation 502 that Captures response data and Resets the decompressor (CR) to a starting seed state, i.e.

state 202 of FIG. 2, followed by a shift operation 504, whereby the tester inputs CI data to the TCA decompressor 104 and receives CO data from the TCA compactor, i.e. state 204 of FIG. 2. The shift operation 504 continues until the parallel scan paths are filled with stimulus data and emptied of response data. The scan cycle of FIG. 5 repeats 508 until the TCA test is complete.

FIGS. 4 and 5 have illustrated an example of how a tester 404 can access a device's TCA 102 for testing when a connection can be made between the tester and the device's TCA interface. As seen in FIG. 4 the connection between the tester and device TCA requires a direct connection for the CI signal, a direct connection for the SC signal, a direct connection for the SE signal and a direct connection for the CO signal.

FIG. 6 illustrates an example of a device 602 with a TCA 102 being connected to an external JTAG controller 606 via the device's test access port (TAP) 604. The TAP is a well known device test interface defined in IEEE standard 1149.1. The interface between the JTAG controller 606 and TAP 604 includes test data input (TDI), test clock (TCK), test mode select (TMS), and test data output (TDO) signals. The TAP 604 is adapted to interface with the TCA's CI, SC, SE and CO signals. This example allows device manufacturer test patterns to be applied to the device TCA from a JTAG controller.

FIG. 7 illustrates the TAP 604 in more detail and its interface to TCA 102. The TAP 604 includes a TAP controller 702, instruction register (IR) 704, single bit bypass register (BR) 706, boundary scan register (BSR) 708, multiplexer 710, multiplexer 712, and decode circuit 714, all connected as shown. The TAP controller 702 responds to TCK and TMS to shift data through the IR 704, the BR 706, or the BSR 708 from TDI to TDO according to the TAP controller state diagram of FIG. 8. During shift operations, multiplexers 710 and 712 couple the selected register's output to TDO. As seen, the TCA is interfaced to the TAP and operates as an additional data register that can be selected and accessed via TDI and TDO. The instruction shifted into the IR 704 is input to the decode circuit 714 which controls which data register (BR, BSR, or TCA) is selected for access. The decode circuit also receives the TCK and signals from the TAP controller 702 to generate output control signals 716 required to access a selected data register (BR, BSR, or TCA). As seen, when the TCA is selected the decoder circuit 714 provides the SC and SE control signals to the TCA via bus 716.

FIG. 9 illustrates the TAP 604 responding to the JTAG controller 606 to transition through states of FIG. 8 to operate the TCA SC and SE control signals during a TCA scan cycle. In this example, and in response to a TCA select instruction loaded into IR 704, the SC signal is coupled to the Clock-DR signal from the TAP controller 702, via the decode circuit 716, and the SE signal is coupled to the Shift-DR signal from the TAP controller 702, via the decode circuit 716. The Clock-DR and Shift-DR signals are TAP controller signals defined in the IEEE 1149.1 standard used to capture and shift the data register selected by the current instruction in IR 704. The scan cycle includes a capture operation 902 during the Capture-DR state of FIG. 8 that Captures response data and Resets the decompressor (state 202) followed by a shift operation 904 (state 204) during the Shift-DR state of FIG. 8, whereby the JTAG controller 606 inputs CI data to the TCA decompressor 104 and receives CO data from the TCA compactor 106. The shift operation 904 continues until the parallel scan paths are filled with stimulus data and emptied of response data. As seen in FIG. 9, after the shift operation 904 the TAP controller must transition through the Exit1-DR, Update-DR, and Select-DR states 906 of FIG. 8 before returning to the Capture-DR state, so the TCA scan cycle of FIG. 9 is not as efficient time-wise as the TCA scan cycle of FIG. 5. However, the less efficient TCA scan cycle of FIG. 9 is advantageous over the TCA scan cycle of FIG. 5 since the TCA scan cycle of FIG. 9 can be applied at any point in the devices 602 life cycle, i.e. device manufacturing through end product use, since the device TAP signals are dedicated and are always available for access by a JTAG controller. As with TCA scan cycle of FIG. 5, the TCA scan cycle of FIG. 9 repeats 908 until the TCA test is complete.

FIGS. 6 through 9 have illustrated an example of how to adapt a device's TAP 604 to where it can access a device's TCA for testing when a connection can be made between a JTAG controller 606 and the device's TAP 604. As seen in FIG. 6 the connection between the JTAG controller 606 and device TAP 604 requires a direct connection for the TDI signal, a direct connection for the TCK signal, a direct connection for the TMS signal, and a direct connection for the TDO signal to allow the TCA test patterns to be applied to the device during device manufacture.

The present disclosure, as will described in detail below, identifies a problem with using a JTAG controller for applying TCA test patterns to a device when the device exists in a daisy-chain arrangement along with other devices, for example in a customers system. The disclosure provides novel solutions to resolve this TCA test pattern application problem.

BRIEF SUMMARY OF THE DISCLOSURE

This disclosure describes methods and apparatuses for allowing a JTAG controller to reapply the device manufacturer's TCA test patterns to the device when the device exists in a JTAG daisy-chain arrangement along with other devices.

BRIEF DESCRIPTION OF THE VIEWS OF THE DRAWINGS

FIG. 1 illustrates a conventional test compression architecture (TCA) within a device.

FIG. 2 illustrates the basic operations of a TCA.

FIG. 3 illustrates the stimulus and response connections between combinational logic and TCA scan paths in a device.

FIG. 12A illustrates a device with a TCA in a JTAG daisy-chain arrangement with trailing devices.

FIG. 12B illustrates a device with a TCA in a JTAG daisy-chain arrangement with leading and trailing devices.

FIG. 12C illustrates a device with a TCA in a JTAG daisy-chain arrangement with leading devices.

FIG. 13 illustrate a device comprising a TCA and a modified TAP to improve TCA testing according to the disclosure.

FIG. 14 illustrates the modified TAP of FIG. 13 in more detail according to the disclosure.

FIG. 25 illustrates the operation of the SBD circuit of FIG. 24 according to the disclosure.

FIG. 26 illustrates timing of TCA scan cycles using the SBD circuit of FIG. 24 according to the disclosure.

DETAILED DESCRIPTION OF THE DISCLOSURE

In the following description of the disclosure, FIGS. 10, 11, and 12A-12C are provided to illustrate and describe device TCA testing problems when the device exists in a JTAG daisy-chain arrangement. FIGS. 13 through 44A-44C are provided to illustrate and describe solutions, according to the disclosure, that resolve device TCA testing problems in JTAG daisy-chain arrangements.

Figure 10:
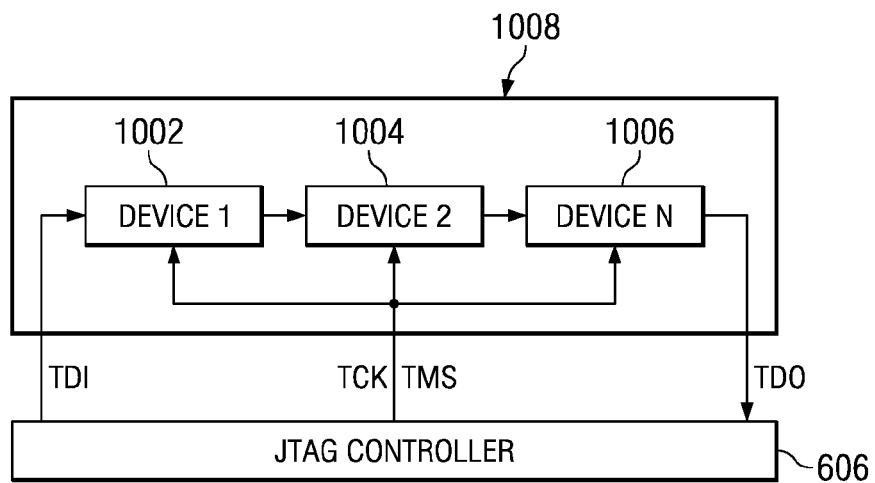
FIG. 10 illustrates a group of devices in a daisy-chain arrangement connected to a JTAG controller.

FIG. 10 illustrates N devices 1002-1006 in a serial daisy-chain arrangement 108 that is connected to a JTAG controller 606. Each device includes a TAP 604 including TDI, TCK, TMS and TDO interface signals. As seen the first device 1002 is connected to the TDI output from the JTAG controller and the last device 1006 is connected to the TDO input to the JTAG controller. Intermediate devices 1004 are connected in series with the first and last devices via TDI and TDO. All devices are connected to the TMS and TCK outputs from the JTAG controller. This configuration between the JTAG controller and series of daisy-chained devices is well known in the industry.

The arrangement 108 of devices 1002-1006 could be; (1) an arrangement of embedded core circuits within an IC, (2) an arrangement of ICs in an IC manufacturing test environment, (3) an arrangement of ICs in a customer's system such as a computer or cell phone, or (4) any other arrangement where the devices 1002-1006 need to be connected in series and accessed by a JTAG controller for test, emulation, debug, and/or other operations.

Figure 11:
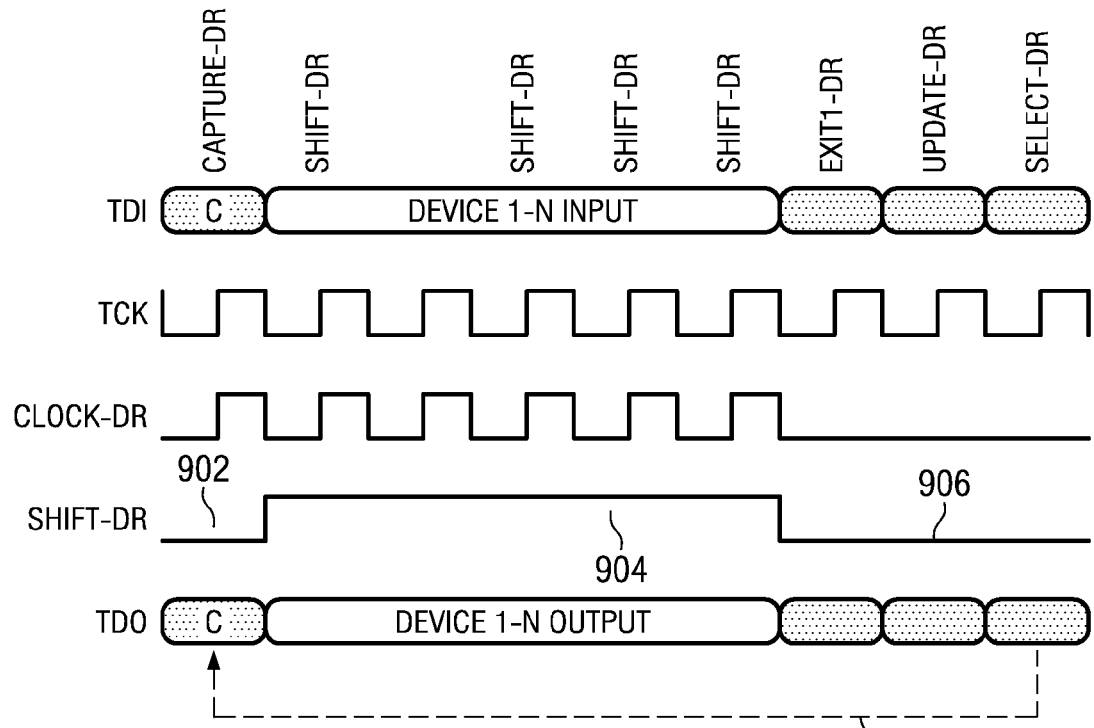
FIG. 11 illustrates a JTAG controller applying JTAG scan cycles to the devices in the daisy-chain arrangement.

FIG. 11 illustrates an example JTAG data register scan cycle whereby data registers in all devices 1002-1006 in arrangement 108 capture (C) data at time 902 then shift data from the JTAG controller's TDI output to the JTAG controller's TDO input at time 904. The scan cycle can be repeated 908 as required by transitioning the device TAPs through TAP states Exit1-DR, Update-DR, and Select-DR 906 to re-enter the Capture-DR state. The scan cycle of FIG. 11 is similar to the scan cycle of FIG. 9 with the exception that a series of devices 1002-1006 are operated to capture and shift during the scan cycle of FIG. 11 instead of the single device of FIG. 9.

FIGS. 12A-12C are provided to illustrate the problem of reapplying a manufacturers test patterns to the device's TCA 102 when the device exists in a serial daisy-chain arrangement with other devices as shown in FIG. 10.

In FIG. 12A the TAP instruction register (IR) 704 of device 1002 has been loaded with an instruction that selects the TCA 102 between the device's TDI and TDO terminals and the TAP instruction registers (IR) 704 of the other devices 1004-1006 have been loaded with an instruction that selects their single bit bypass register (BR) between their TDI and TDO device terminals. During scan cycles the TAPs of the devices are controlled by a JTAG controller 606 to perform the capture 902 and shift 904 operations shown in FIG. 11. During the capture operation 902 the parallel scan paths of device 1002 capture response data and the TCA decompressor 104 is reset, as described in regard to FIG. 9. Also during the capture operation the single bit BRs of devices 1004-1006 are loaded with a logic zero, as required in the JTAG IEEE 1149.1 standard. During the shift operation 904 compressed input (CI) data is shifted directly into the device TCA from the JTAG controller 606 and compressed output (CO) data is shifted from the device TCA to the JTAG controller, via the BRs of trailing devices 1004-1006.

As can be seen and understood, the shift operation 904 of each scan cycle of FIG. 12A will need to be extended to allow the CO outputs from the device 1002 TCA to pass through the BRs of trailing devices 1004-1006 to be input to the JTAG controller 606. Extending the shift operation of each scan cycle by the number of trailing device BRs means that the manufacturer's TCA test patterns developed for testing device 1002 directly, as shown in regard to FIGS. 6-9, will have to be modified to include the additional shift operations to traverse the trailing device BRs. For example in arrangement 1008 of FIG. 12A if 20 device 1004-1006 BRs exist between the TDO output of device 1002 and the TDO input to a JTAG controller 606, each TCA scan cycle will have to be modified to include 20 additional shifts per scan cycle.

In FIG. 12B the TAP instruction register (IR) 704 of device 1004 has been loaded with an instruction that selects the TCA 102 between the device's TDI and TDO terminals and the TAP instruction registers (IR) 704 of devices 1002 and 1006 have been loaded with an instruction that selects their single bit bypass register (BR) between their TDI and TDO device terminals. During scan cycles the TAPs of the devices are controlled by a JTAG controller 606 to perform the capture 902 and shift 904 operations shown in FIG. 11. During the capture operation 902 the parallel scan paths of device 1004 capture response data and the TCA's decompressor 104 is reset, as described in regard to FIG. 9. Also during the capture operation 902 the single bit BRs of devices 1002 and 1006 are loaded with a logic zero, as required in the JTAG IEEE 1149.1 standard. During the shift operation 904, the compressed input (CI) data from a JTAG controller 606 is shifted into the device 1004 TCA via leading BRs of devices 1002 and the compressed output (CO) data from the device 1004 TCA is shifted out to the JTAG controller 606 via trailing BRs of devices 1006.

As can be seen and understood, the shift operation 904 of each scan cycle of FIG. 12B will need to be extended by the number of leading device BRs and trailing device BRs. Extending the shift operation of each scan cycle by the number of leading and trailing device BRs means that the device manufacturer's TCA test patterns developed for testing device 1004 directly, as shown in regard to FIGS. 6-9, will have to be modified to include the additional shift operations to traverse the leading and trailing device BRs. For example in arrangement 1008 of FIG. 12B if 10 leading and 10 trailing BRs between the device 1004 and a JTAG controller 606, each TCA scan cycle will have to be modified to include 20 additional shifts per scan cycle.

In FIG. 12C the TAP instruction register (IR) 704 of device 1006 has been loaded with an instruction that selects the TCA 102 between the device's TDI and TDO terminals and the TAP instruction registers (IR) 704 of devices 1002-1004 have been loaded with an instruction that selects their single bit bypass register (BR) between their TDI and TDO device terminals. During scan cycles the TAPs of the devices are controlled by a JTAG controller 606 to perform the capture 902 and shift 904 operations shown in FIG. 11. During the capture operation 902 the parallel scan paths of device 1006 capture response data and the TCA's decompressor 104 is reset, as described in regard to FIG. 9. Also during the capture operation 902 the single bit BRs of devices 1002-1004 are loaded with a logic zero, as required in the JTAG IEEE 1149.1 standard. During the shift operation 904, the compressed input (CI) data from a JTAG controller 606 is shifted into the device 1006 TCA via leading BRs of devices 1002-1004 and the compressed output (CO) data from the device 1006 TCA is directly shifted out to the JTAG controller 606.

As can be seen and understood, the shift operation 904 of each scan cycle of FIG. 12C will need to be extended by the number of leading device 1002-1004 BRs. Extending the shift operation of each scan cycle by the number of leading device BRs means that the device manufacturer's TCA test patterns developed for testing device 1006 directly, as shown in regard to FIGS. 6-9, will have to be modified to include the additional shift operations to traverse the leading device BRs. For example in arrangement 1008 of FIG. 12C if 20 leading BRs between the device 1006 and the JTAG controller 606, each TCA scan cycle will have to be modified to include 20 additional shifts per scan cycle.

The above mentioned need, in FIGS. 12A-12C, to extend the shift 904 phase of each scan cycle with additional shift operations to traverse the leading and/or trailing BRs means that the manufacturer's TCA test patterns cannot be used to test devices when they exist in a daisy-chain arrangement 1008. Thus the device manufacturer's TCA test patterns would need to be modified for use in various daisy-chain arrangements 1008. For example one user of a manufactured device (customer 1) may place the device in an arrangement 1008 with 10 leading devices, while another user of the same manufactured device (customer 2) may place the device in an arrangement 1008 with 20 leading devices. To support device TCA testing for both customers, the device manufacturer would have to provide a first device TCA test pattern set for the arrangement 1008 used by customer 1 and a second device TCA test pattern set for arrangement used by customer 2. Additional TCA test patterns would be required for each new arrangement used by another customer.

In addition to the above described need to modify the device manufacturer's TCA test patterns to include additional shift operations for leading and/or trailing BRs, the arrangements 1008 of FIGS. 12B and 12C introduce an additional TCA test problem, as described below.

As previously described in regard to the direct device to JTAG controller manufacturing connection of FIGS. 6-9, the device TCA expects to input the manufacturing test pattern CI data immediately at the start of each scan cycle shift operation 904. However, as can be seen in FIGS. 12B and 12C, the TCAs of devices 1004 and 1006 input bypass bits (BB) from leading BRs at the start of each scan cycle shift operation 904, instead of CI data from the JTAG controller 606. As previously mentioned in regard to FIGS. 12A-12C, the BRs are loaded with logic zeros during the capture 902 phase of each scan operation. Thus the TCA's decompressor, instead of immediately receiving the CI data, receives a stream of logic zero BBs prior to receiving the CI data.

Since the decompressor 104 is clocked by SC during shift operation 904 it responds to the logic low BBs to start producing pattern outputs to the input SI inputs of the parallel scan paths, as described in FIG. 2. The input of the logic zero BBs, prior to input of the CI data, will cause the TCA's decompressor 104 to advance from its reset state (starting seed state) to some other state determined by the number of BBs the decompressor receives. When the decompressor finally starts receiving CI data from the JTAG controller, it will be in a state that is different from its intended starting seed state. Since the decompressor will not be in the expected starting seed state, the device manufacturer's TCA test patterns will not be able to control the decompressor via the CI input to produce the intended stimulus outputs to the parallel scan paths, which invalidates the TCA test.

While it is possible to create a new TCA test pattern set that anticipates the decompressor starting in a state different from its intended starting state, there would need to be a TCA test pattern set for each arrangement 1008 the device is placed in. For example one user of a manufactured device (customer 1) may place the device in an arrangement 1008 with 10 leading devices, while another user of the same manufactured device (customer 2) may place the device in an arrangement 1008 with 20 leading devices. To support device TCA testing for both customers, the device manufacturer would have to provide a first device TCA test pattern set for the arrangement 1008 used by customer 1 and a second device TCA test pattern set for arrangement used by customer 2. Additional TCA test patterns would be required for each new arrangement used by other customers.

As can be seen, the modified manufacturer's TCA test patterns described above extends the time it takes to test a device's TCA since the shift phase 904 of each scan cycle is increased by the number of BRs in the arrangement 1008.

Figure 4:
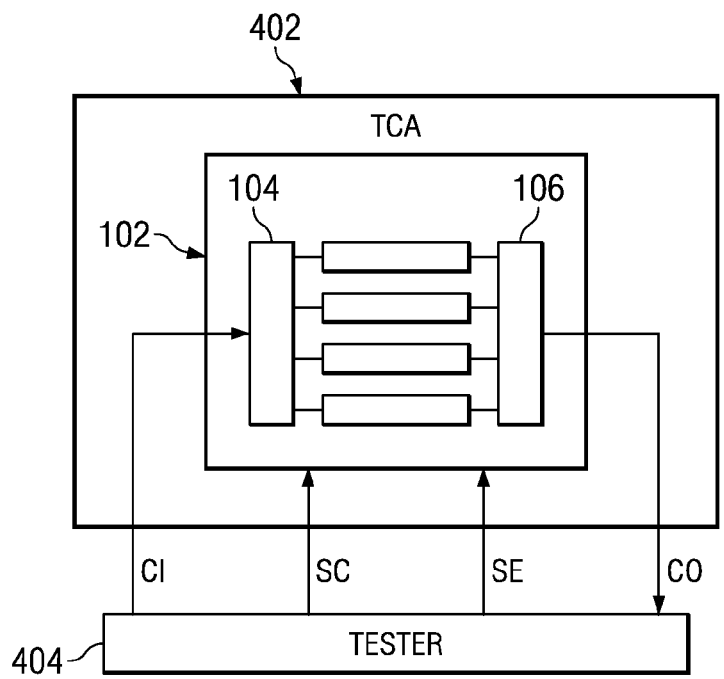
FIG. 4 illustrates a connection between a tester and a device TCA.
Figure 5:
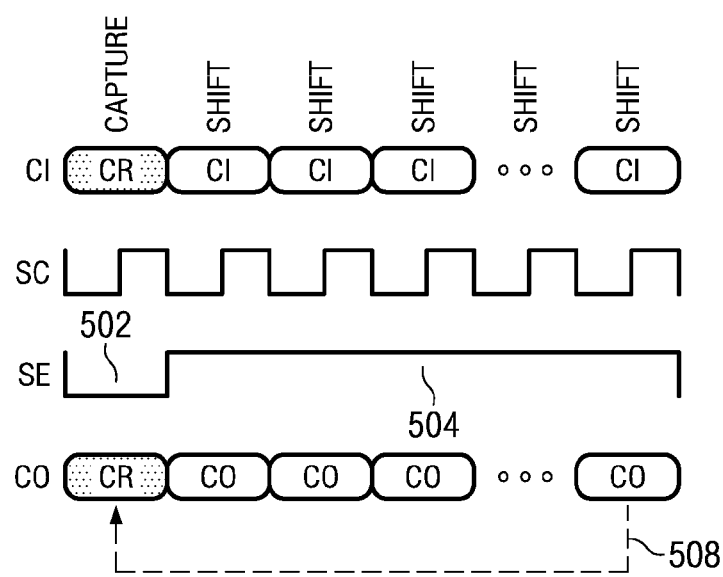
FIG. 5 illustrates timing of a tester applying TCA scan cycles.
Figure 6:
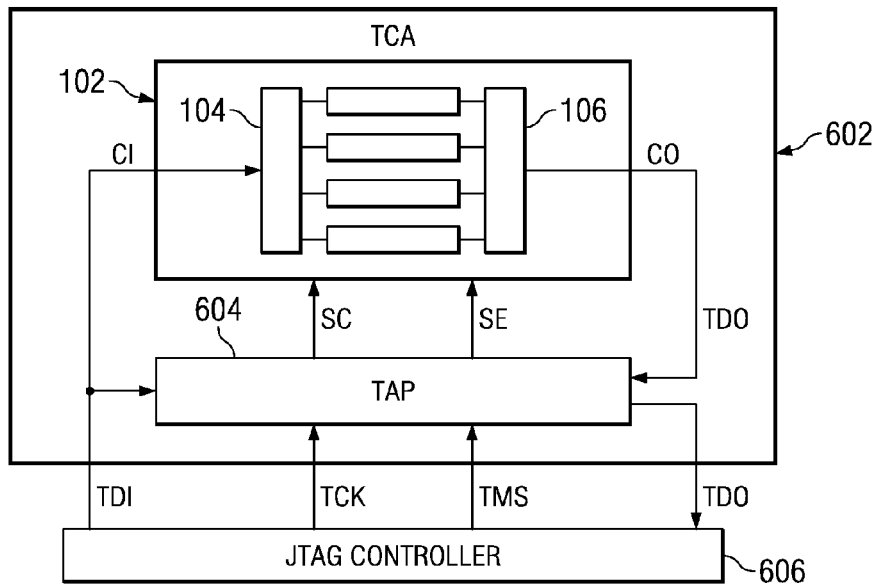
FIG. 6 illustrates a connection between a JTAG controller and a device TAP that accesses a TCA for testing.
Figure 7:
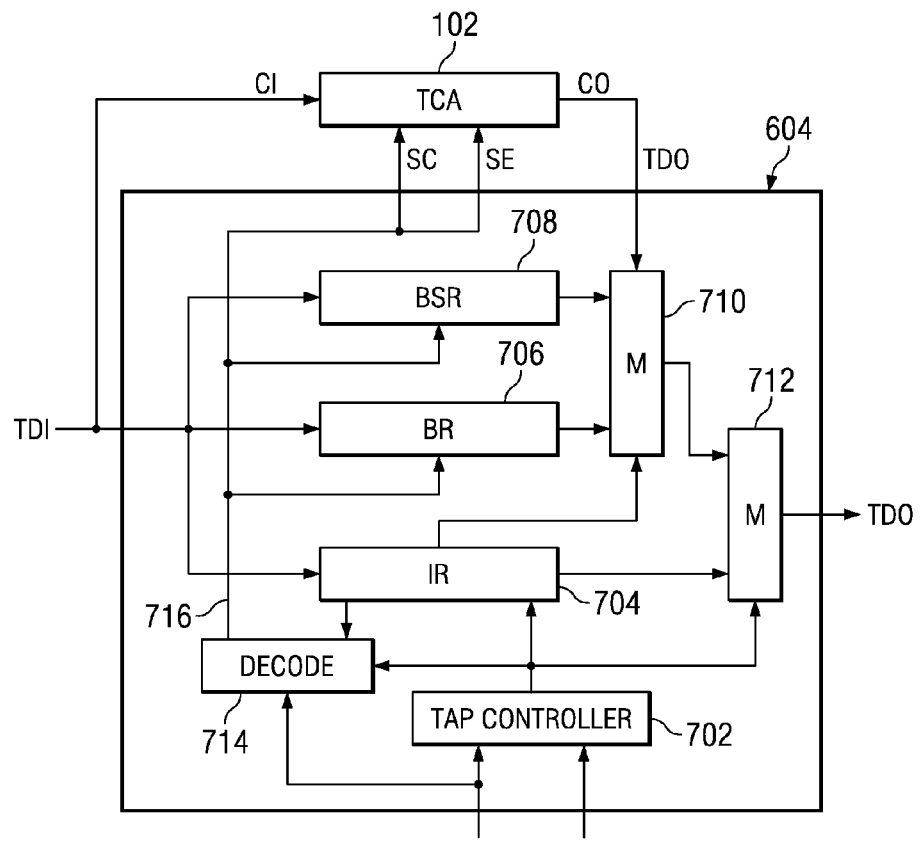
FIG. 7 illustrates the device TAP in more detail.

The present disclosure, as described below, provides device TCA design approaches that enable the device to be tested in either the manufacturing test arrangement of FIG. 6 or the daisy-chain test arrangement of FIG. 10 using the same TCA test pattern set. Additionally, the device TCA design approaches enable the device TCA test times of the manufacturing test (FIG. 6) and daisy-chain test (FIG. 10) to be almost the same.

In the following, a first TCA design approach is described in regard to FIGS. 13-22, a second TCA design approach is described in regard to FIGS. 23-33, and a third TCA design approach is described in regard to FIGS. 34-43.

First TCA Design Approach Description

FIG. 13 illustrates a device 1302 comprising a TCA 102 and TAP 1304 connected as shown. TAP 1304 is the same as TAP 604 of FIG. 7 with the exception that it is modified to allow SC signals to be output to the TCA 102 when the TAP controller 702 is in the Pause-DR state. The arrangement of FIG. 13 illustrates a direct way the device manufacturer would apply TCA test patterns to the TCA of device 1302 from a JTAG controller 606.

FIG. 14 illustrates one example of how to modify TAP 1304 to produce SC signals during the Pause-DR state. In the standard TAP 604 of FIG. 6, the Clock-DR signal from the TAP controller 702 is enabled to drive the TCA's SC input signal by an output from the instruction register (IR) 704 that is set whenever a TCA test instruction is loaded into the IR 704. In this example the SC signal is enabled to be driven by Clock-DR signal via an And gate 1404 and OR gate 1408 when And gate 1404 is enabled by an output from IR 704. When And gate 1404 is enabled, TCA testing can occur as previously described in regard to FIGS. 6-9. It should be noted that if TCA testing is being performed as described in FIG. 6-9, the OR gate 1408 is not necessary and the output of And gate 1404 can directly drive the SC input to the TCA.

To achieve the operation of the present disclosure, the OR gate 1408 is required along with an additional And gate 1406. Also a new TCA test instruction is defined to enable the operation of the present disclosure. As seen, both And gates 1404 and 1406 are enabled by outputs from IR 704 when the new TCA instruction is loaded. And gate 1404 produces SC signal outputs during the Capture-DR state and Shift-DR state as described in FIGS. 6-9. And gate 1406 produces SC signal outputs whenever the TAP controller 702 is in the Pause-DR state. In this example, And gate 1406 is enabled to pass the TCK signal to the SC output whenever it is enabled by the new TCA instruction and the TAP controller 702 is in the Pause-DR state.

Figure 8:
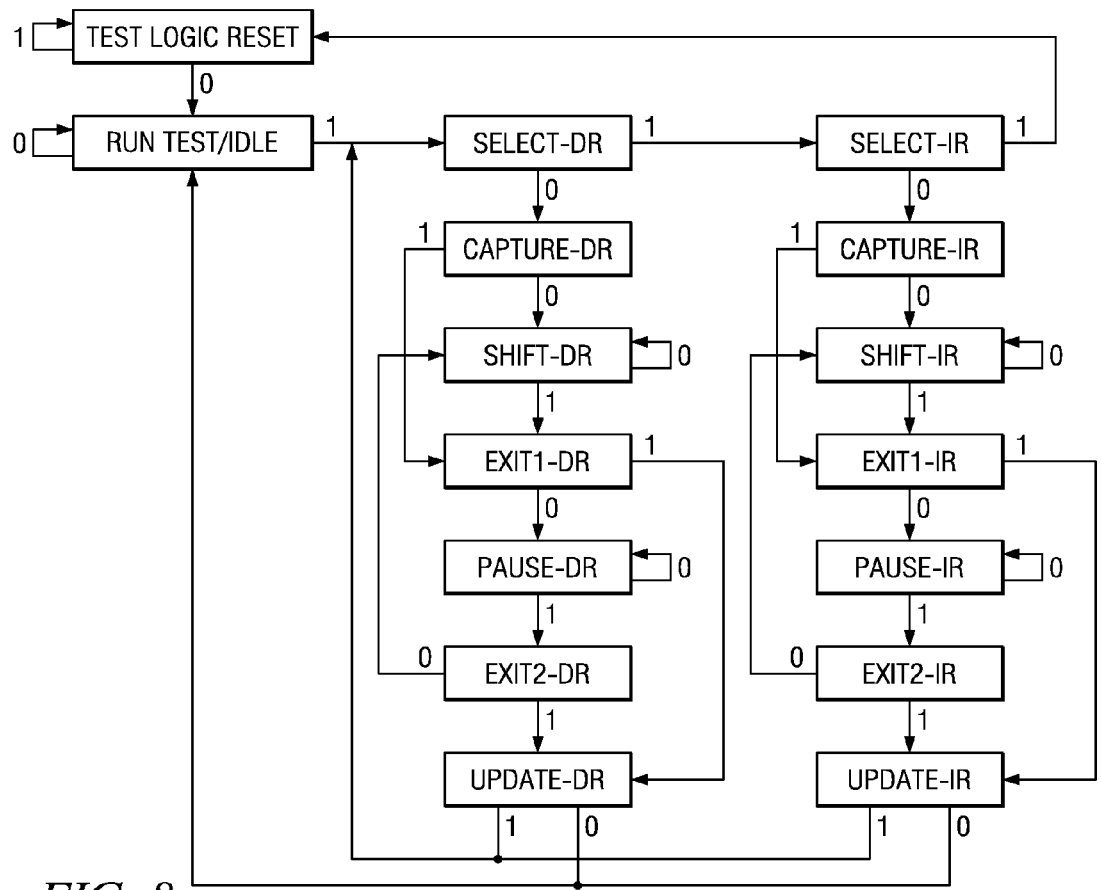
FIG. 8 illustrates the state diagram of the device TAP's TAP controller.
Figure 15:
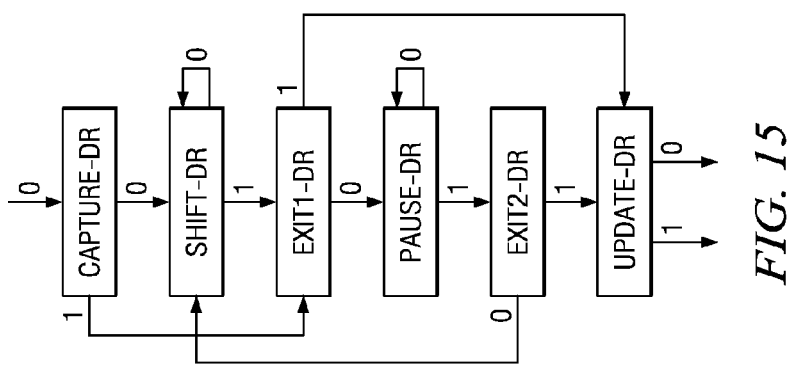
FIG. 15 illustrates a simplified view of the TAP state diagram of FIG. 8.

FIG. 15 illustrates a simplified view of the TAP controller diagram of FIG. 8.

Figure 16:
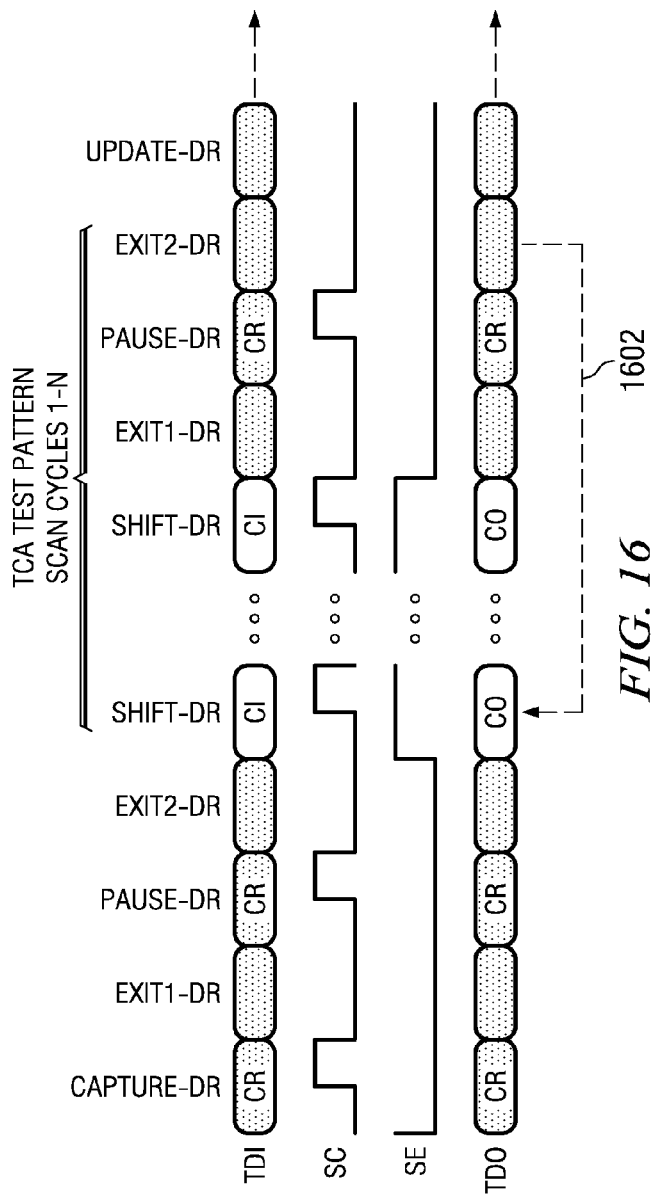
FIG. 16 illustrates timing of TCA scan cycles using the modified TAP of FIG. 13 according to the disclosure.

FIG. 16 illustrates the timing diagram of how device manufacturers TCA test patterns can be applied using the new TCA test instruction of the present disclosure. As seen the TCA test starts by transitioning the TAP controller 702 into the Capture-DR state of FIG. 15. In the Capture-DR state the SE signal is low and an SC signal occurs which causes the parallel scan paths 108 to capture response data and the decompressor 104 to reset (CR), as previously described the timing diagram of FIG. 9. From the Capture-DR state the TAP controller 702 transitions to the Exit1-DR state then to the Pause-DR state. In the Pause-DR state And gate 1406 is enabled by the TAP controller 702 to pass the TCK signal to the SC signal which repeats the capturing of response data into the parallel scan paths and the resetting of the decompressor 104. The Pause-DR signal to And gate 1406 can be produced by connecting a gate 3406 to the Tap controller's 702 state bus to detect when the TAP controller is in the Pause-DR state, as seen in circuit arrangement 3408 of FIG. 34. From the Pause-DR state the TAP controller transitions to the Exit2-DR state then to the Shift-DR state. In the Shift-DR state, SE is set high to enable the parallel scan paths to shift, the TCA's decompressor inputs CI data from TDI, and the TCA's compactor outputs CO data to TDO. When the input of CI data and output of CO data is complete the TAP controller transitions from the Shift-DR state to the Pause-DR state via the Exit1-DR state. In the Pause-DR state the SE signal is low and an SC signal occurs to cause the parallel scan paths to capture data and the decompressor to reset (CR). From the Pause-DR state the TAP controller 702 transitions to the Shift-DR state via the Exit2-DR state to again input CI data and output CO data. This process of entering the Pause-DR state to capture response data into the scan paths and reset the decompressor followed by entering the Shift-DR state to input CI data to the decompressor 104 from TDI and output CO data from the compactor 102 on TDO forms the TCA scan cycle of the new TCA instruction of the present disclosure. This new TCA scan cycle repeats 1602 until all TCA test patterns have all been applied. At the end of the TCA test the TAP controller will transition from the Exit2-DR state to the Update-DR state and on to the next TAP controller state.

Figure 9:
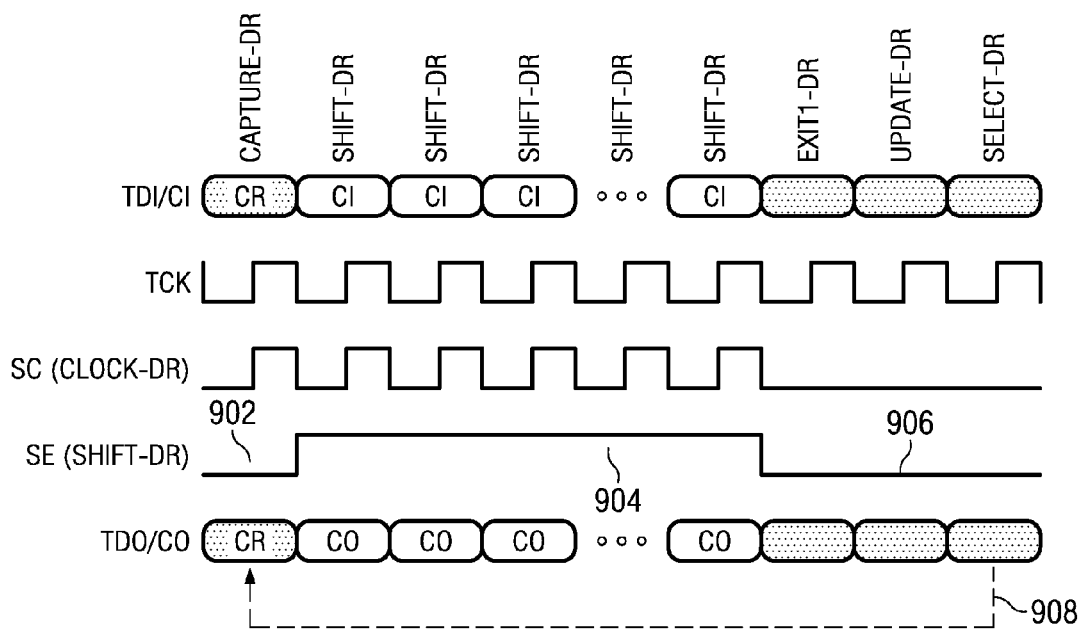
FIG. 9 illustrates timing of a JTAG controller applying TCA scan cycles.

As can be seen the TCA scan cycle of FIG. 16 is similar to the one described in FIG. 9 with the exception that the capturing of response data into the scan paths and the resetting of the decompressor occurs in the Pause-DR state instead of in the Capture-DR state. Also as can be seen the TAP controller only enters the Capture-DR state at the beginning of the TCA test. The benefit of applying device manufacturing TCA test patterns using TCA scan cycles that do not have to enter the Capture-DR state will be appreciated in the following JTAG daisy-chain arrangement descriptions of FIG. 17-22.

Figure 17:
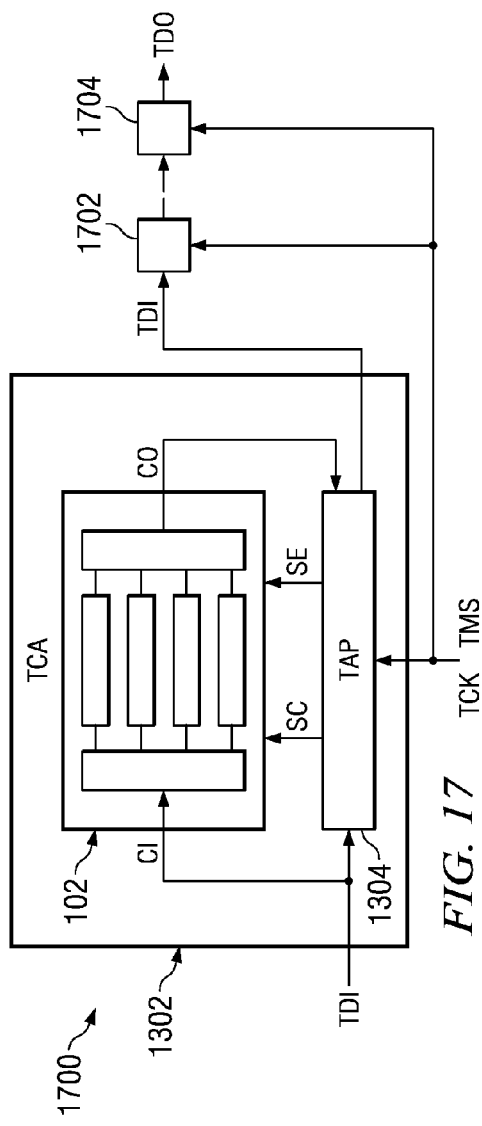
FIG. 17 illustrates the device of FIG. 13 in a daisy-chain arrangement with trailing devices.

FIG. 17 illustrates device 1302 of FIG. 13 being placed in JTAG daisy-chain arrangement 1700 with a number of trailing devices 1702-1704. The daisy-chain arrangement of FIG. 17 could be a customer's system that uses device 1302. The daisy-chain arrangement 1700 of FIG. 17 is similar to daisy-chain arrangement 1008 of FIG. 12A. When a TCA test is to be performed on device 1302, the IR 704 of device 1302 is loaded with the new TCA test instruction described in FIGS. 13-16 and IRs of devices 1702-1704 are loaded with instructions that select their BRs.

Figure 18:
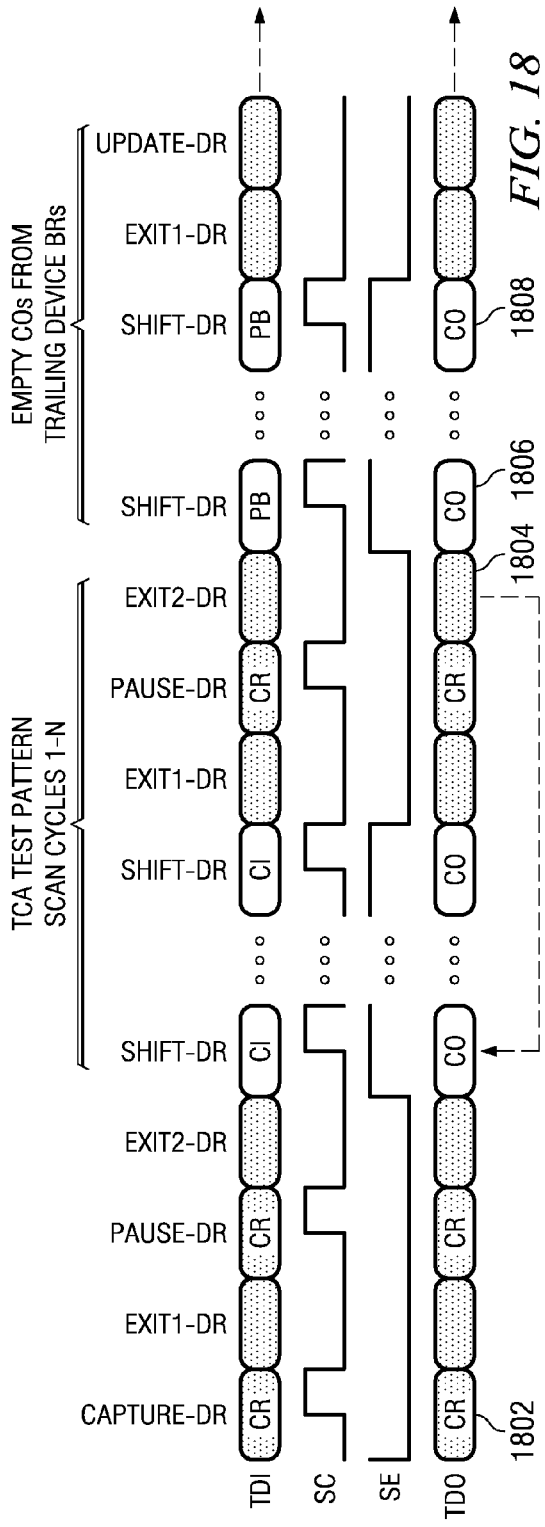
FIG. 18 illustrates timing to apply TCA scan cycles to the device of FIG. 17 according to the disclosure.

FIG. 18 illustrates the timing diagram of how the device manufacturer's TCA test patterns may be reapplied to device 1302 when device 1302 exists in the daisy-chain arrangement 1700 of FIG. 17. As can be seen in comparing the timing diagram of FIG. 18 with the one in FIG. 16, the device manufacturer TCA test patterns are applied using scan cycles that are identical in operation to the scan cycles described in FIG. 16 from timing point 1802 to timing point 1804. The only difference between the timing diagrams of FIGS. 16 and 18 is that at the end of test when all manufacturer TCA test patterns have been applied to device 1302, the timing diagram of FIG. 18 performs one last scan cycle at timing points 1806 to 1808 to allow the CO data that has been shifted into the BRs of the trailing devices 1702-1704 to be shifted out to the JTAG controller 606. Following this last shift operation to unload CO data from the BRs the TCA test completes by transitioning from the Shift-DR state to the Update-DR state via the Exit1-DR state.

As can be seen and appreciated the same device TCA test pattern set used by the device 1302 manufacturer can be reapplied in a customer's daisy-chain arrangement 1700 simply by performing a last scan cycle to unload CO data from the trailing device BRs. The reason the manufacturer's TCA test pattern set can be reapplied comes from the fact that the new TCA test instruction of the present disclosure avoids using the Capture-DR state to capture response into the TCA's scan paths and reset the TCA's decompressor. By not using the Capture-DR state during TCA scan cycles, the BRs of the trailing devices are never set to a logic zero during the TCA test, which allows the BRs to operate as pipeline bits between the TDO output of device 1302 and the TDO input to the JTAG controller 606. During the last scan cycle of FIG. 18 appropriate pad bits (PB) are applied to the TDI input of device 1302 from the JTAG controller.

Figure 19:
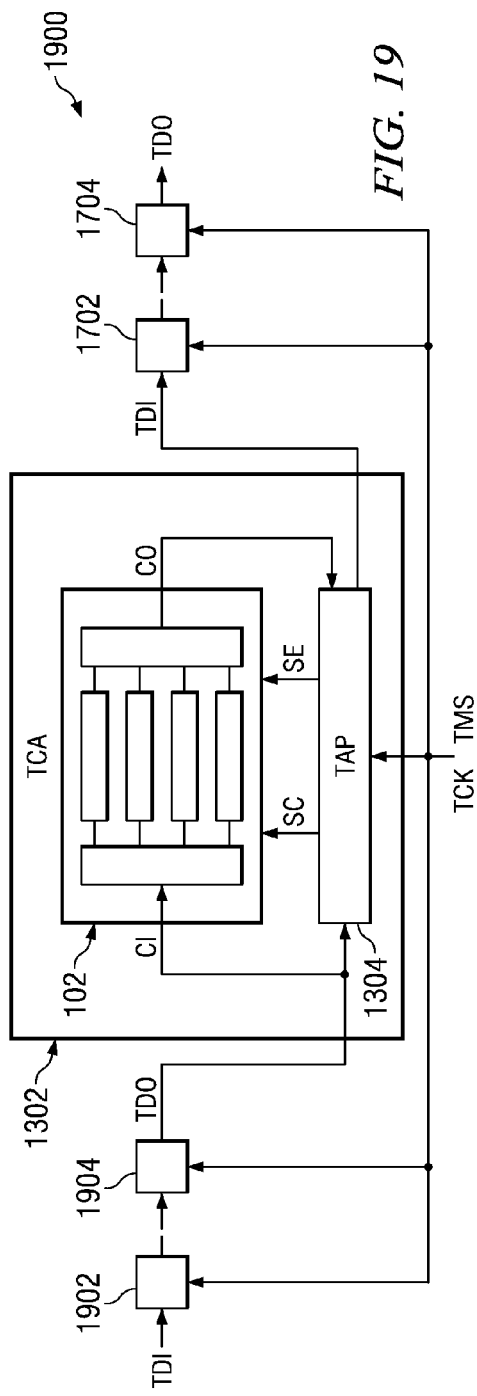
FIG. 19 illustrates the device of FIG. 13 in a daisy-chain arrangement with leading and trailing devices.

FIG. 19 illustrates device 1302 of FIG. 13 being placed in JTAG daisy-chain arrangement 1900 with a number of leading devices 1902-1904 and trailing devices 1702-1704. The daisy-chain arrangement of FIG. 19 could be a customer's system that uses device 1302. The daisy-chain arrangement 1900 of FIG. 19 is similar to daisy-chain arrangement 1008 of FIG. 12B. When a TCA test is to be performed on device 1302, the IR 704 of device 1302 is loaded with the new TCA test instruction described in FIGS. 13-16 and IRs of devices 1902-1904 and 1702-1704 are loaded with instructions that select their BRs.

Figure 20:
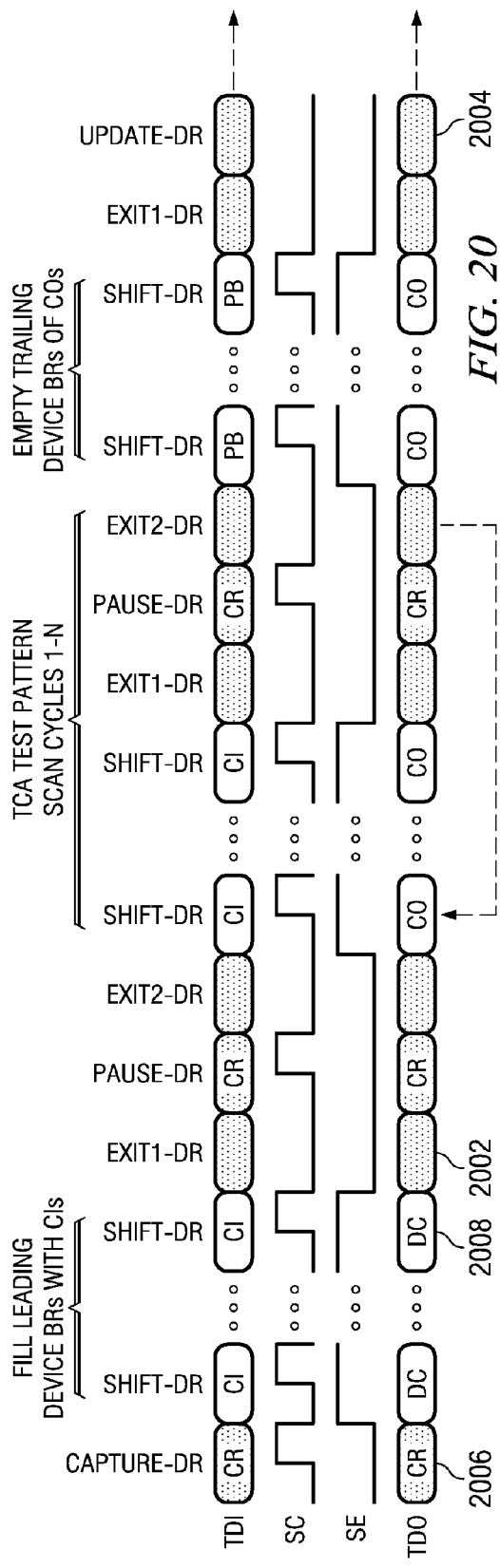
FIG. 20 illustrates timing to apply TCA scan cycles to the device of FIG. 19 according to the disclosure.

FIG. 20 illustrates the timing diagram of how the device manufacturer's TCA test patterns may be reapplied to device 1302 when device 1302 exists in the daisy-chain arrangement 1900 of FIG. 19. As can be seen in comparing the timing diagram of FIG. 19 with the one in FIG. 18, the device manufacturer TCA test patterns are applied using scan cycles that are identical in operation to the scan cycles described in FIG. 18 from timing point 2002 to timing point 2004. The only difference between the timing diagrams of FIGS. 20 and 18 is that at the beginning of the TCA test a first scan cycle is performed between timing points 2006 and 2008 to allow the CI data from the JTAG controller to be shifted into the BRs of the leading devices 1902-1904. Following this first scan cycle operation to load CI data into the leading BRs the TCA test executes until completion as described in the timing diagram of FIG. 18.

As can be seen and appreciated the same device TCA test pattern set used by the device 1302 manufacturer can be reapplied in a customer's daisy-chain arrangement 1900 simply by performing a first scan cycle to load CI data into leading device BRs and a last scan cycle to unload CO data from trailing device BRs. Again, the reason the manufacturer's TCA test pattern set can be reapplied comes from the fact that the new TCA test instruction of the present disclosure avoids using the Capture-DR state to capture response into the TCA's scan paths and reset the TCA's decompressor. By not using the Capture-DR state during TCA scan cycles, the BRs of leading and trailing devices are never set to a logic zero during the TCA test, which allows the BRs to operate as leading and trailing pipeline bits between the JTAG controller 606 and device 1302. During the first scan cycle of FIG. 20 the data output to the JTAG controller's TDO input are considered don't care bits (DC).

Figure 21:
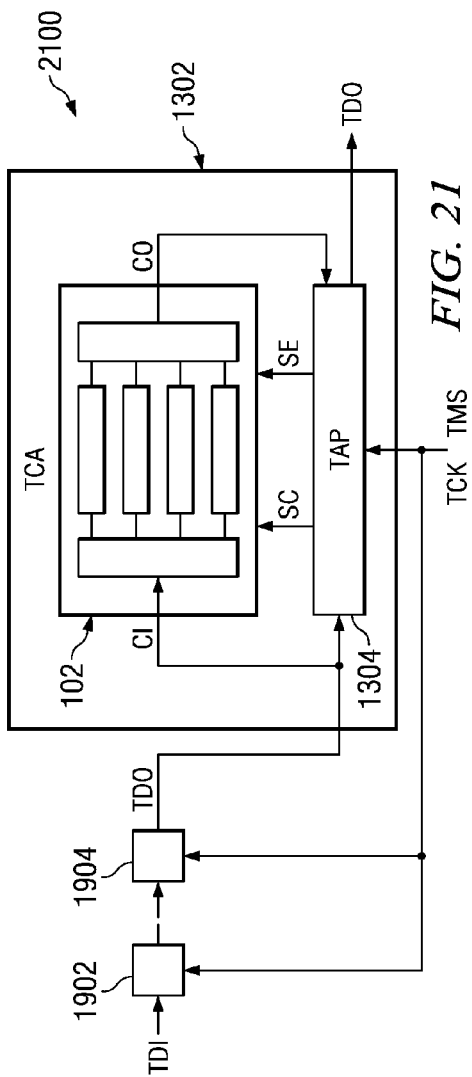
FIG. 21 illustrates the device of FIG. 13 in a daisy-chain arrangement with leading devices.

FIG. 21 illustrates device 1302 of FIG. 13 being placed in JTAG daisy-chain arrangement 2100 with a number of leading devices 1902-1904. The daisy-chain arrangement of FIG. 21 could be a customer's system that uses device 1302. The daisy-chain arrangement 2100 of FIG. 19 is similar to daisy-chain arrangement 1008 of FIG. 12C. When a TCA test is to be performed on device 1302, the IR 704 of device 1302 is loaded with the new TCA test instruction described in FIGS. 13-16 and IRs of devices 1902-1904 are loaded with instructions that select their BRs.

Figure 22:
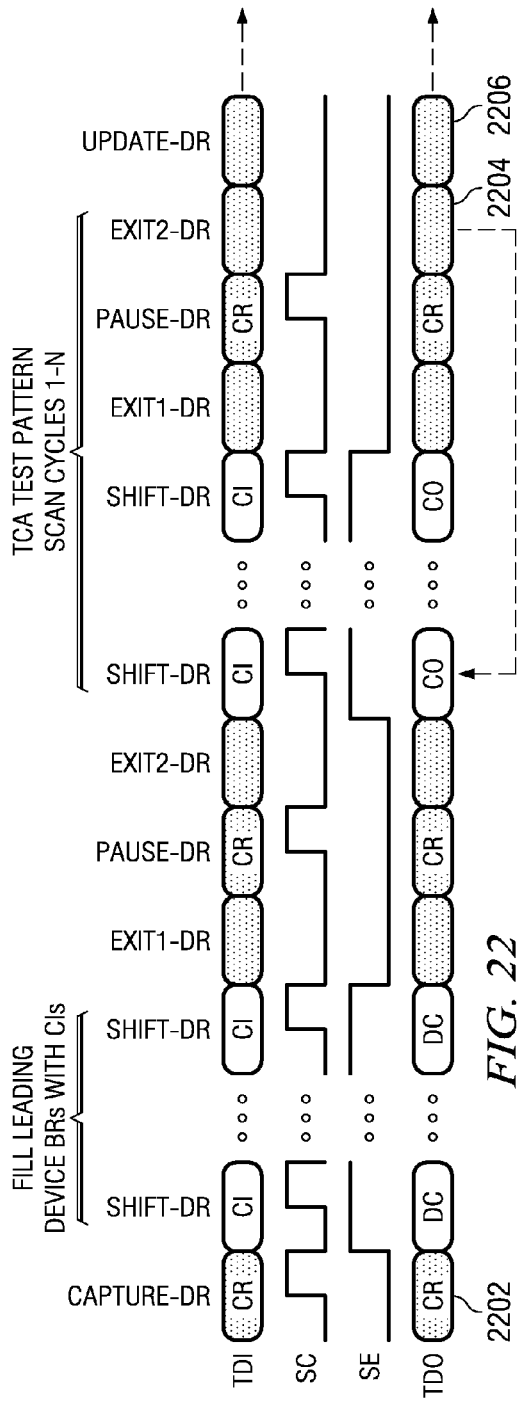
FIG. 22 illustrates timing to apply TCA scan cycles to the device of FIG. 21 according to the disclosure.

FIG. 22 illustrates the timing diagram of how the device manufacturer's TCA test patterns may be reapplied to device 1302 when device 1302 exists in the daisy-chain arrangement 2100 of FIG. 21. As can be seen in comparing the timing diagram of FIG. 22 with the one in FIG. 20, the device manufacturer TCA test patterns are applied using scan cycles that are identical in operation to the scan cycles described in FIG. 20 from timing point 2202 to timing point 2204. The only difference between the timing diagrams of FIGS. 22 and 20 is that since the daisy-chain arrangement 2100 does not include any trailing devices, the last scan cycle at the end of the TCA test is not required and the test ends by simply transitioning from the Exit2-DR state to the Update-DR state 2206 as previously shown and described in regard to the timing diagram of FIG. 16.

As can be seen and appreciated the same device TCA test pattern set used by the device 1302 manufacturer can be reapplied in a customer's daisy-chain arrangement 2100 simply by performing a first scan cycle to load CI data into leading devices BRs. Again, the reason the manufacturer's TCA test pattern set can be reapplied comes from the fact that the new TCA test instruction of the present disclosure avoids using the Capture-DR state to capture response into the TCA's scan paths and reset the TCA's decompressor. By not using the Capture-DR state during TCA scan cycles, the BRs of leading devices are never set to a logic zero during the TCA test, which allows the BRs to operate as leading pipeline bits between the JTAG controller 606 and device 1302.

Second TCA Design Approach Description

Figure 23:
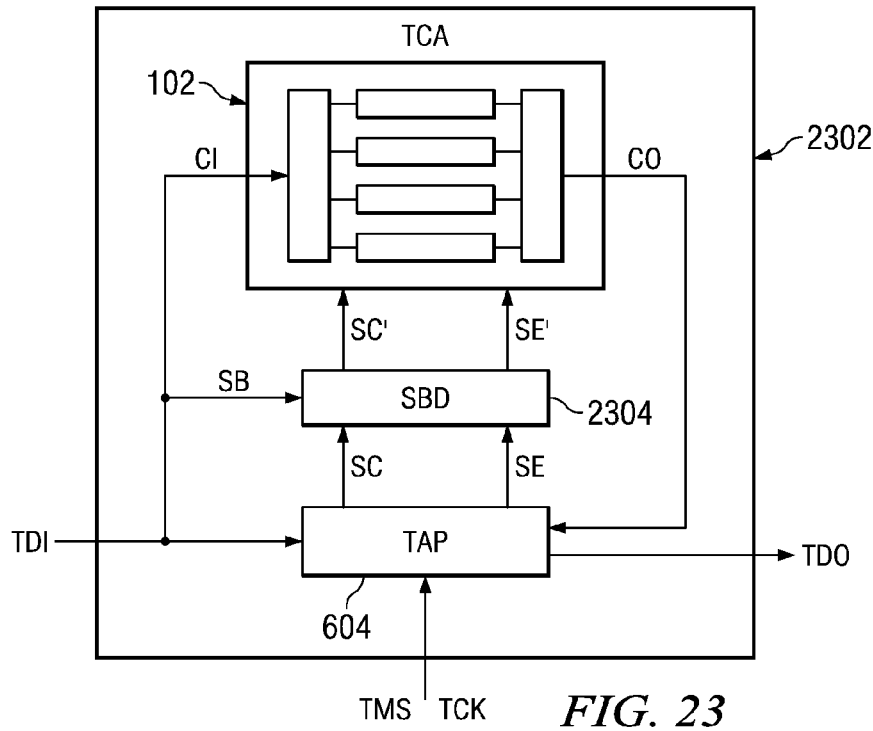
FIG. 23 illustrates a device comprising a TCA, a Start Bit Detector (SBD) circuit, and a TAP to improve TCA testing according to the disclosure.

FIG. 23 illustrates a device 2302 comprising a TCA 102, a TAP 604, and a start bit detector (SBD) circuit 2304 connected as shown. The SBD circuit 2304 is a circuit placed in the device to detect when a TCA test is to start. The SBD circuit 2304 inputs the TDI signal and the SC and SE signals from TAP 604. The SBD circuit outputs an SC' signal and an SE' signal to the TCA 102. When a SBD TCA test instruction is loaded into the TAP 604 the SBD circuit polls the TDI input for a logic high start bit. When the SBD detects the start bit it enables the SC and SE signals from TAP 604 to be input to the TCA via the SC' and SE' signals to start the TCA test. The arrangement of FIG. 23 illustrates a direct way the device manufacturer would apply TCA test patterns to the TCA of device 2302 from a JTAG controller 606.

Figure 24:
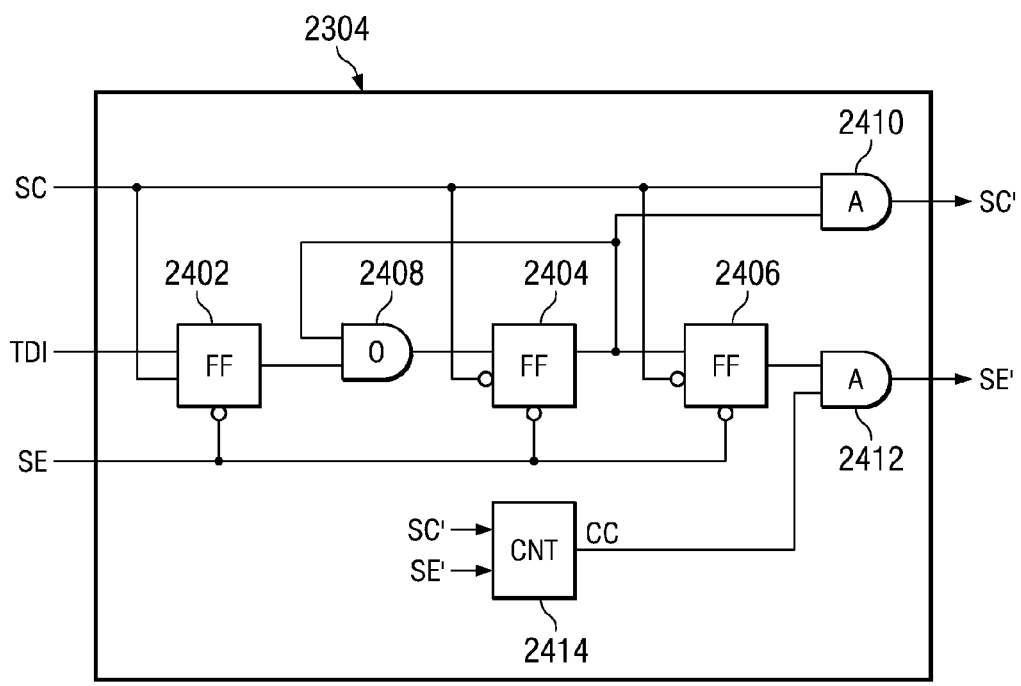
FIG. 24 illustrates the SBD circuit of FIG. 23 in more detail according to the disclosure.

FIG. 24 illustrates one example implementation of the SBD circuit 2304. The SBD 2304 comprises flip flops (FF) 2402-2406, OR gate 2408, And gates 2410 and 2412, and a counter circuit (CNT) 2414. FF 2402 inputs data from TDI, a clock signal from SC, a reset signal from SE, and outputs data to a first input of OR gate 2408. FF 2404 inputs data from the output of OR gate 2408, an inverted clock signal from SC, a reset signal from SE, and outputs data to FF 2406, the second input of OR gate 2408, and a first input of And gate 2410. FF 2406 inputs data from FF 2404, an inverted clock signal from SC, a reset signal from SE, and outputs data to And gate 2412. And gate 2410 inputs the SC signal and the data output of FF 2404 and outputs the SC' signal. And gate 2412 inputs the data output of FF 2406 and a count complete signal (CC) from CNT 2414 and outputs the SE' signal. The CNT 2414 inputs the SC' and SE' signals from And gates 2410 and 2412 and outputs the CC signal to And gate 2412.

To start a TCA test using the SBD 2304 a SBD TCA test instruction is loaded into the IR 704 of TAP 604 and the TAP controller 702 of TAP 604 is transitioned into the Shift-DR state of FIG. 8. During the Shift-DR state the TAP 604 sets SE high and outputs clocks on SC. With SE's high and SC active, FF 2402 samples TDI on each rising edge of SC. When a logic one (the start bit) is loaded into FF 2402 on a rising edge of SC it is clocked into FF 2404 on the next falling edge of SC. The output of FF 2404 is fed back to the input of FF 2404 to latch FF 2404 at a logic high. The logic high output of FF 2404 is input to And gate 2410 to enable SC to pass to SC'. The logic high of FF 2404 is also input to FF 2406 on the next falling edge of SC. The logic high output of FF 2406 enables And gate 2412 to pass the CC signal to SE'. CC is initially a logic high which causes SE' to go high. With SE' high and SC' active the CNT 2414 start to count and the TCA 102 starts a TCA shift phase of a TCA scan operation to input CI from TDI and output CO on TDO of device 2302. When the CNT 2414 reaches a predetermined shift count it sets CC low on the falling edge of SC' for one SC' clock period. SE' goes low with CC going low which causes the TCA to capture response data into the scan paths 108 and reset the decompressor 104. CNT 2414 is reset for a new count on the rising edge of SC' and the CC output goes high on the next falling edge of SC'. SE' goes high when CC goes high to start the shift phase of the next TCA scan cycle. The SDB circuit 2304 repeats above mentioned TCA capture and shift phases for each scan cycle applied by the manufacturer's TCA test pattern set. When the TCA test is complete the TAP controller 702 exits the Shift-DR state which sets SE low to reset FFs 2402-2406 and disable the SBD 2304. As can be seen the TCA test operation executes while the TAP controller 702 is in the Shift-DR state of FIG. 8 and ceases executing when the TAP controller 702 exits the Shift-DR state. While the TAP controller is in the Shift-DR state the SBD 2304 controls the capture and shift operation of each TCA scan cycle.

FIG. 25 illustrates a state diagram depicting the operation of SBD 2304. At the beginning of a TCA test operation the TAP controller 702 will be in the Shift-DR state and the SBD will be in state 2502 polling the TDI input for a logic high start bit. When a start bit is detected the SBD transitions to state 2504 to capture response into scan paths 108, reset the decompressor 104, and reset the counter 2414. From state 2504 the SBD transitions to state 2506 to shift the scan paths 108, operate the TCA's decompressor 104 and compactor 106, and operate the counter. SBD remains in state 2506 while CC is high. When CC goes low the SBD transitions back to state 2504 to perform the above mentioned state 2504 operations. The SBD will operate in states 2504 and 2506 until the SBD controlled TCA test is complete, which is indicated by the TAP controller transitioning out of the Shift-DR state.

FIG. 26 illustrates the timing diagram of how device manufacturers TCA test patterns can be applied using the SBD TCA test instruction of the present disclosure. As seen the TCA test starts by transitioning the TAP controller 702 into the Capture-DR state of FIG. 8 which enables SC clock outputs from TAP 604. Next the TAP controller 702 transitions to the Shift-DR state to input the state bit (SB). In response to the start bit the SBD performs a first TCA scan cycle by outputting a first SC' clock 2602 to capture response into the TCA's scan paths 108 and reset the TCA's decompressor 104 followed by additional SC's clocks 2604 to input CI data on TDI and output CO data on TDO of device 2302. When the counter's CC output goes low the SBC starts the next TCA scan cycle by performing a capture operation with SC' clock 2606 and shift operations with SC' clocks 2608. The SBD repeats 2610 the TCA capture/reset (CR) clock 2606 and shift clocks 2608 in response to a low on CC for each remaining TCA scan cycle in the TCA test pattern set. When the TCA test is complete the TAP controller 702 transitions from the Shift-DR state to disable the SBD.

As can be seen from the above description of FIGS. 23-26, the TAP controller 702 only enters the Capture-DR state once at the beginning of the SBD controlled TCA test. The TAP controller 702 remains in the Shift-DR state for the duration of the SBD controlled TCA test. The benefit of applying device manufacturing TCA test patterns using SBD controlled TCA scan cycles while the TAP controller remains in the Shift-DR state will be appreciated in the following JTAG daisy-chain arrangement descriptions of FIG. 28-33.

Figure 27A:
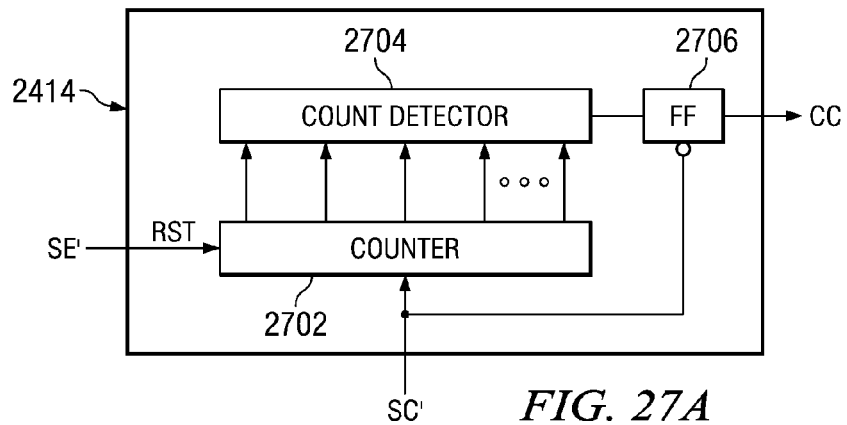
FIGS. 27A and 27B illustrate example counters that can be used in the SBD circuit of FIG. 24.
Figure 27B:
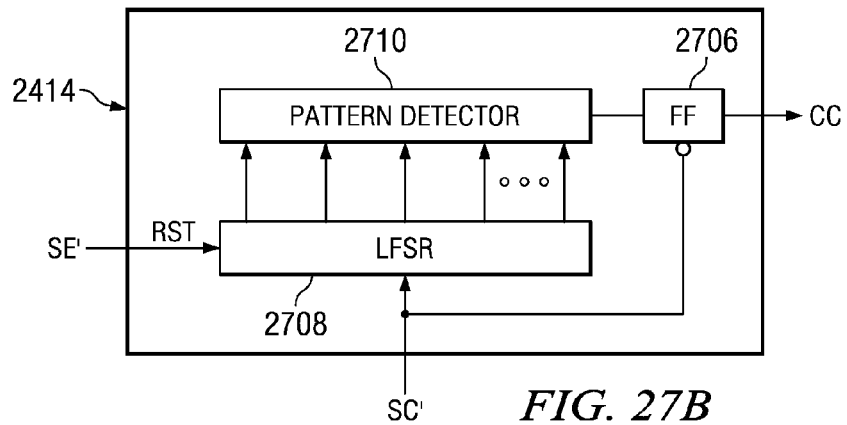

FIGS. 27A and 27B are provided simply to give examples of how the SBD counter 2414 may be designed. FIG. 27A uses a counter 2702 and a count detector circuit 2704 which outputs a signal on CC via falling edge clocked FF 2706 when the counter reaches a predetermined count. The counter is clocked by SC' and synchronously reset by SE' low. FIG. 27B uses a linear feedback shift register (LFSR) 2708 and a pattern detector circuit 2710 which outputs a signal on CC via falling edge clocked FF 2706 when the LFSR reaches a predetermined pattern. The LFSR is clocked by SC' and synchronously reset by SE' going low.

Figure 28:
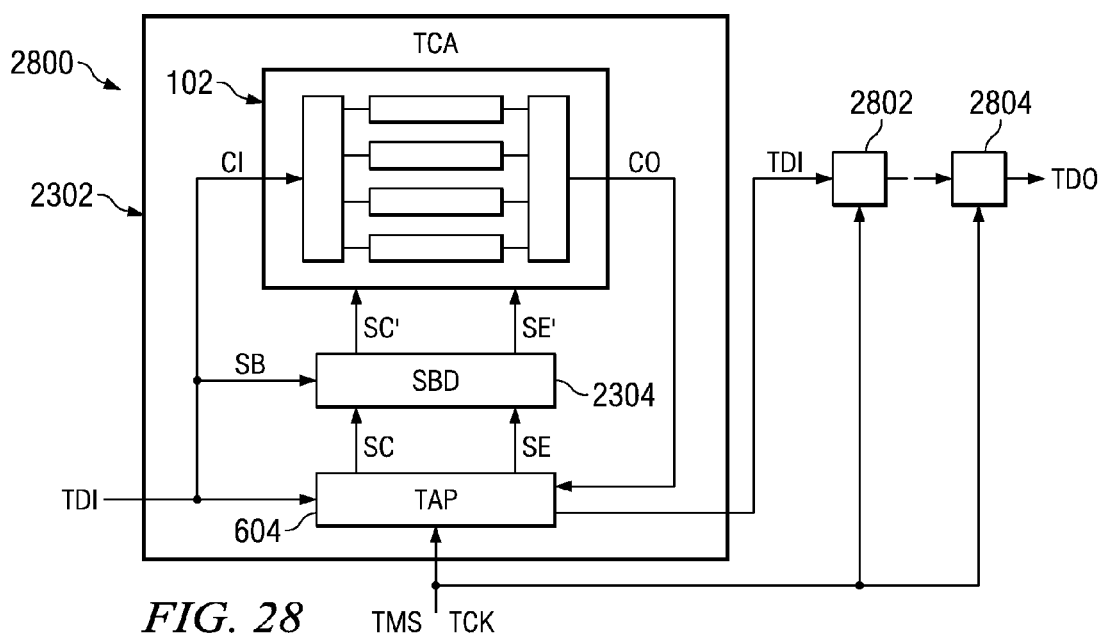
FIG. 28 illustrates the device of FIG. 23 in a daisy-chain arrangement with trailing devices.

FIG. 28 illustrates device 2302 of FIG. 23 being placed in JTAG daisy-chain arrangement 2800 with a number of trailing devices 2802-2804. The daisy-chain arrangement of FIG. 28 could be a customer's system that uses device 2302. The daisy-chain arrangement 2800 of FIG. 28 is similar to daisy-chain arrangement 1008 of FIG. 12A. When a SBD controlled TCA test is to be performed on device 2302, the IR 704 of device 1302 is loaded with the SBD TCA test instruction described in FIGS. 23-26 and IRs of devices 2802-2804 are loaded with instructions that select their BRs.

Figure 29:
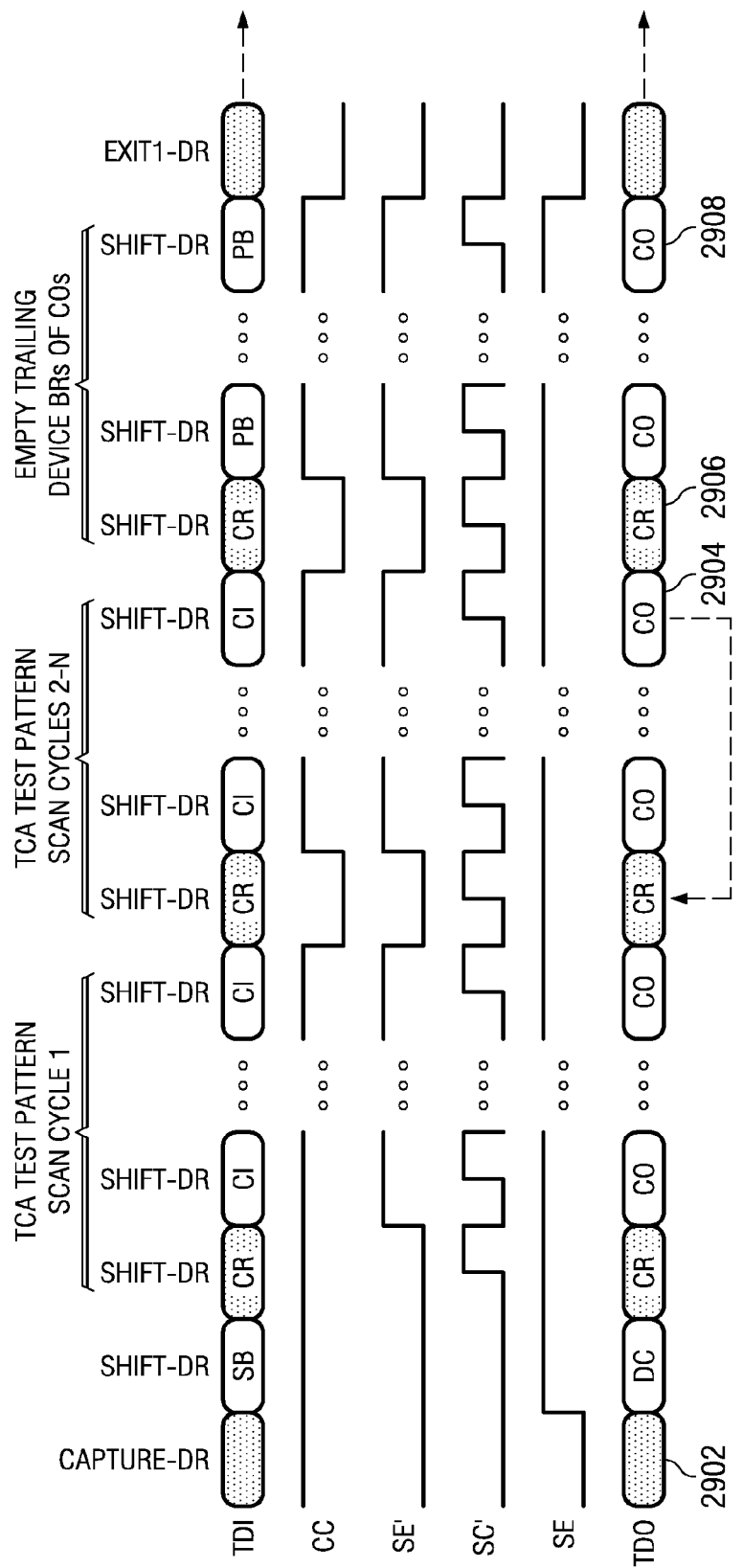
FIG. 29 illustrates timing to apply TCA scan cycles to the device of FIG. 28 according to the disclosure.

FIG. 29 illustrates the timing diagram of how the device manufacturer's TCA test patterns may be reapplied to device 2302 when device 2302 exists in the daisy-chain arrangement 2800 of FIG. 28. As can be seen in comparing the timing diagram of FIG. 29 with the one in FIG. 26, the device manufacturer TCA test patterns are applied using SBD controlled scan cycles that are identical in operation to the SBD controlled scan cycles described in FIG. 26 from timing point 2902 to timing point 2904. The only difference between the timing diagrams of FIGS. 26 and 29 is that at the end of test when all manufacturer TCA test patterns have been applied to device 1302, the timing diagram of FIG. 29 performs one last scan cycle at timing points 2906 to 2908 to allow the CO data that has been shifted into the BRs of the trailing devices 2802-2804 to be shifted out to the JTAG controller 606. Following this last shift operation to unload CO data from the BRs the SBD TCA test completes by transitioning from the Shift-DR state to the Exit1-DR state.

As can be seen and appreciated the same device TCA test pattern set used by the device 2302 manufacturer can be reapplied in a customer's daisy-chain arrangement 2800 simply by performing a last scan cycle to unload CO data from the trailing device BRs. The reason the manufacturer's TCA test pattern set can be reapplied comes from the fact that the new SBD TCA test instruction of the present disclosure avoids using the Capture-DR state to capture response into the TCA's scan paths and reset the TCA's decompressor. By not using the Capture-DR state during SBD controlled TCA scan cycles, the BRs of the trailing devices are never set to a logic zero during the TCA test, which allows the BRs to operate as pipeline bits between the TDO output of device 2302 and the TDO input to the JTAG controller 606. Since the trailing device BRs operate as pipeline bits, the time to apply the TCA test patterns is the same as the direct manufacturing TCA test arrangement of FIG. 23 with the exception of the time it takes to do the last scan cycle to empty the BR pipeline bits of CO data. During the last scan cycle of FIG. 29 appropriate pad bits (PB) are applied to the TDI input of device 1302 from the JTAG controller.

Figure 30:
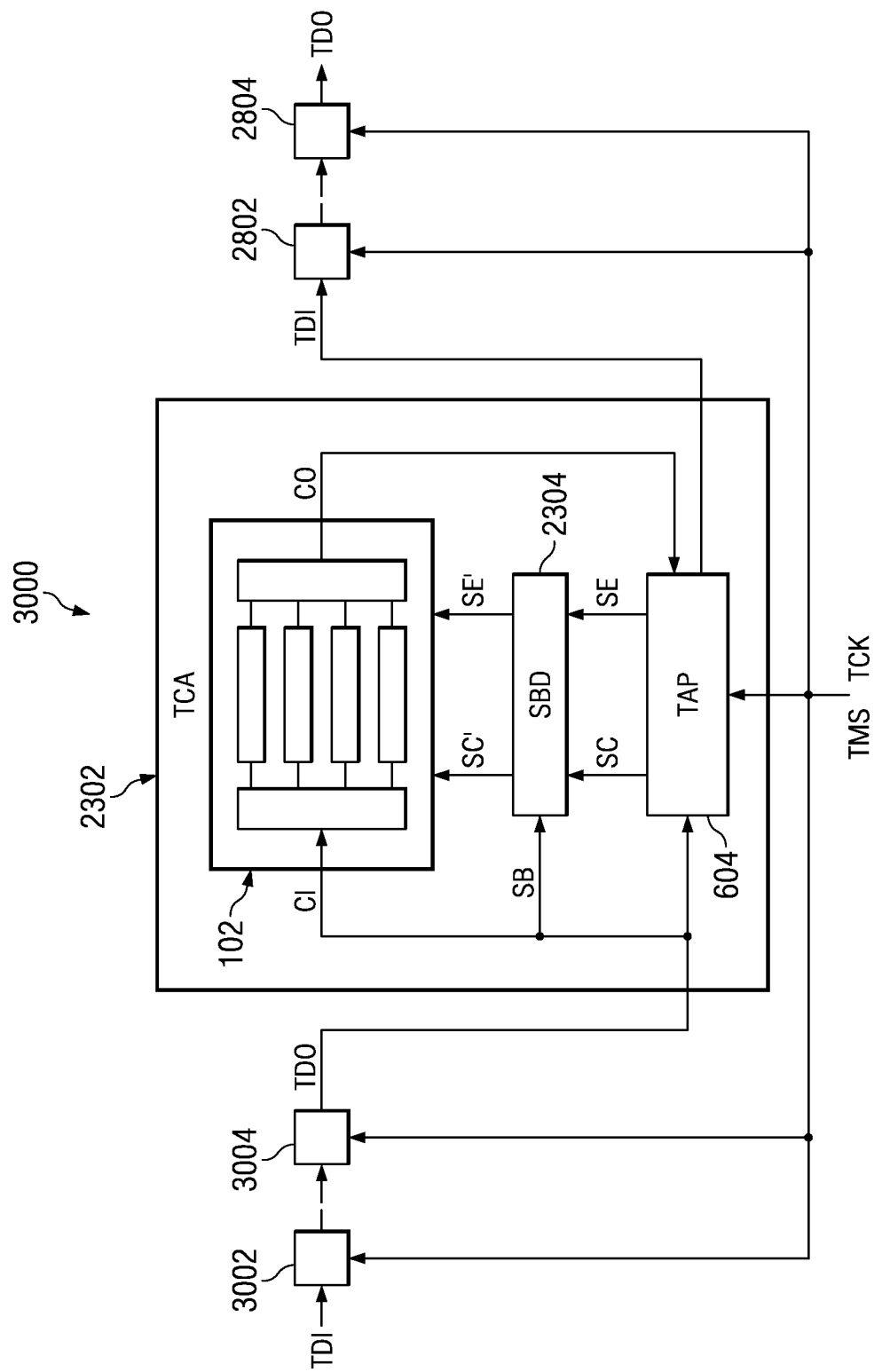
FIG. 30 illustrates the device of FIG. 23 in a daisy-chain arrangement with leading and trailing devices.

FIG. 30 illustrates device 2302 of FIG. 23 being placed in JTAG daisy-chain arrangement 3000 with a number of leading devices 3002-3004 and trailing devices 2802-2804. The daisy-chain arrangement of FIG. 30 could be a customer's system that uses device 2302. The daisy-chain arrangement 3000 of FIG. 30 is similar to daisy-chain arrangement 1008 of FIG. 12B. When a SBD controlled TCA test is to be performed on device 2302, the IR 704 of device 2302 is loaded with the new SBD TCA test instruction described in FIGS. 33-26 and IRs of devices 3002-3004 and 2802-2804 are loaded with instructions that select their BRs.

Figure 31:
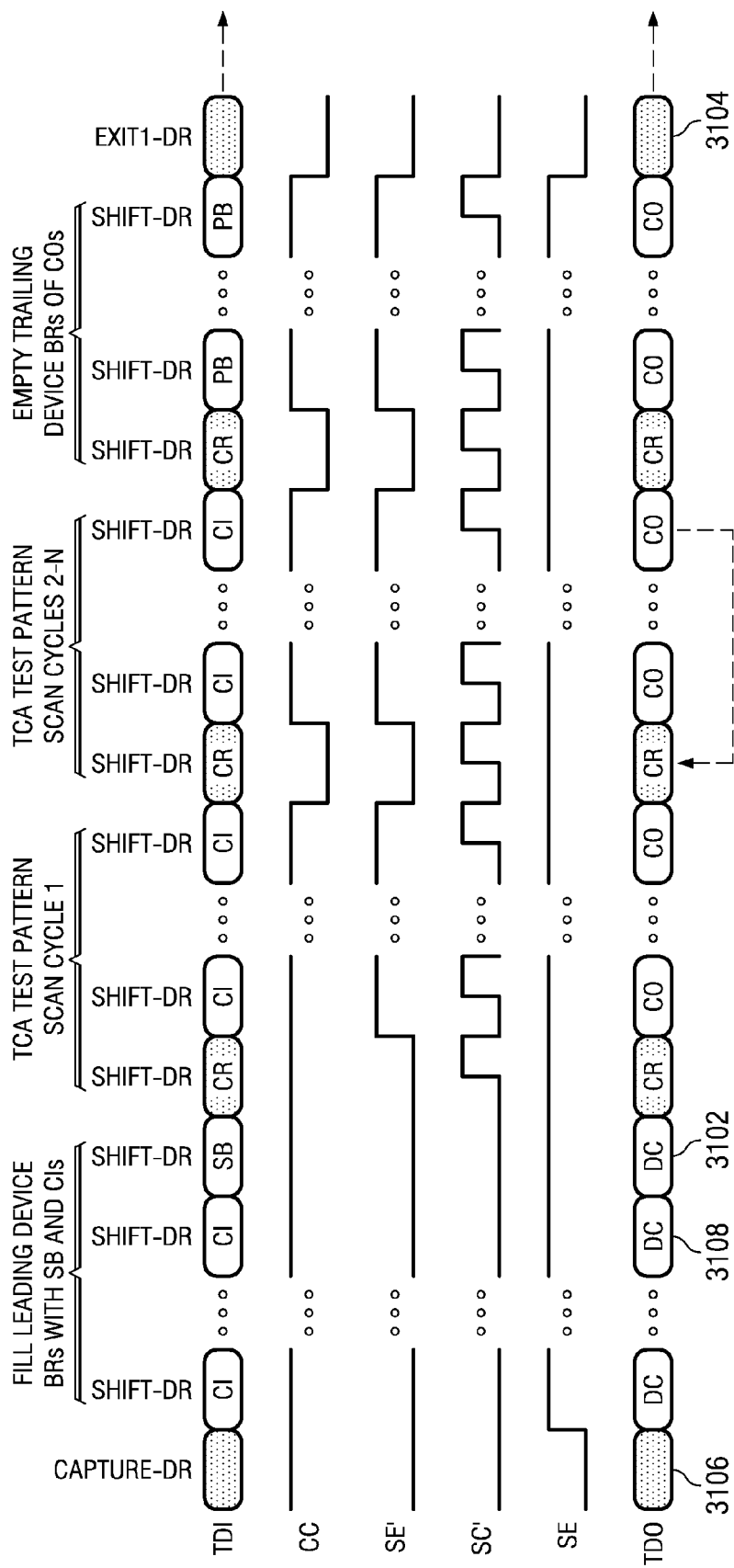
FIG. 31 illustrates timing to apply TCA scan cycles to the device of FIG. 30 according to the disclosure.

FIG. 31 illustrates the timing diagram of how the device manufacturer's TCA test patterns may be reapplied to device 2302 when device 2302 exists in the daisy-chain arrangement 3000 of FIG. 30. As can be seen in comparing the timing diagram of FIG. 31 with the one in FIG. 29, the device manufacturer TCA test patterns are applied using SBD controlled scan cycles that are identical in operation to the scan cycles described in FIG. 29 from timing point 3102 to timing point 3104. The only difference between the timing diagrams of FIGS. 31 and 29 is that at the beginning of the SBD controlled TCA test a first scan cycle is performed between timing points 3106 and 3108 to allow the SB and CI data from the JTAG controller to be shifted into the BRs of the leading devices 3002-3004. It is important to note that the SBD 2304 of device 2302 will not start the TCA test until all the logic low BBs have been shifted out of the leading devices 3002-3004 BRs and the logic high SB has been input to the SBD 2304 of device 2302. Following this first scan cycle operation to load and CI data into the leading BRs and to input the SB to SBD 2304, the SBD controlled TCA test starts and executes until completion as described in the timing diagram of FIG. 29. As can be seen and understood the SBD controlled TCA test operation is delayed from starting by the number of shift operations required to pass the SB through the BRs of leading devices 3002-3004. By delaying the start of the TCA test operation, the TCA's decompressor 104 does not advance from its starting seed state as described in regard to the arrangements 108 of FIGS. 12B-12C.

As can be seen and appreciated the same device TCA test pattern set used by the device 2302 manufacturer can be reapplied in a customer's daisy-chain arrangement 3000 simply by performing a first scan cycle to load the SB and CI data into leading device BRs and a last scan cycle to unload CO data from trailing device BRs. Again, the reason the manufacturer's TCA test pattern set can be reapplied comes from the fact that the new SBD TCA test instruction of the present disclosure avoids using the Capture-DR state to capture response into the TCA's scan paths and reset the TCA's decompressor. By not using the Capture-DR state during SBD controlled TCA scan cycles, the BRs of leading and trailing devices are never set to a logic zero during the TCA test, which allows the BRs to operate as leading and trailing pipeline bits between the JTAG controller 606 and device 2302. Since the leading and trailing device BRs operate as pipeline bits, the time to apply the TCA test patterns is the same as the direct manufacturing TCA test arrangement of FIG. 23 with the exception of the time it takes to do the first and last scan cycles to fill leading devices with CI data and empty trailing devices of CO data. During the first scan cycle of FIG. 31 the data output to the JTAG controller's TDO input are considered don't care bits (DC).

Figure 32:
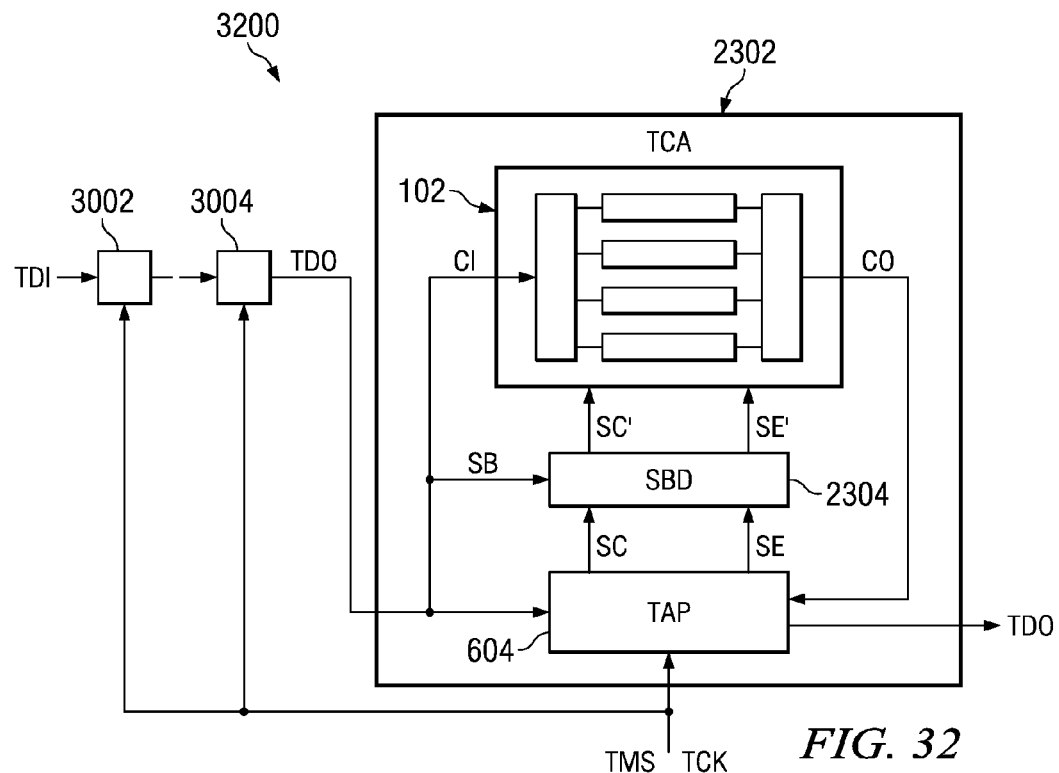
FIG. 32 illustrates the device of FIG. 23 in a daisy-chain arrangement with leading devices.

FIG. 32 illustrates device 2302 of FIG. 23 being placed in JTAG daisy-chain arrangement 3200 with a number of leading devices 3002-3004. The daisy-chain arrangement of FIG. 32 could be a customer's system that uses device 2302. The daisy-chain arrangement 3200 of FIG. 32 is similar to daisy-chain arrangement 1008 of FIG. 12C. When a SBD controlled TCA test is to be performed on device 2302, the IR 704 of device 2302 is loaded with the new SBD TCA test instruction described in FIGS. 23-26 and IRs of devices 3002-3004 are loaded with instructions that select their BRs.

Figure 33:
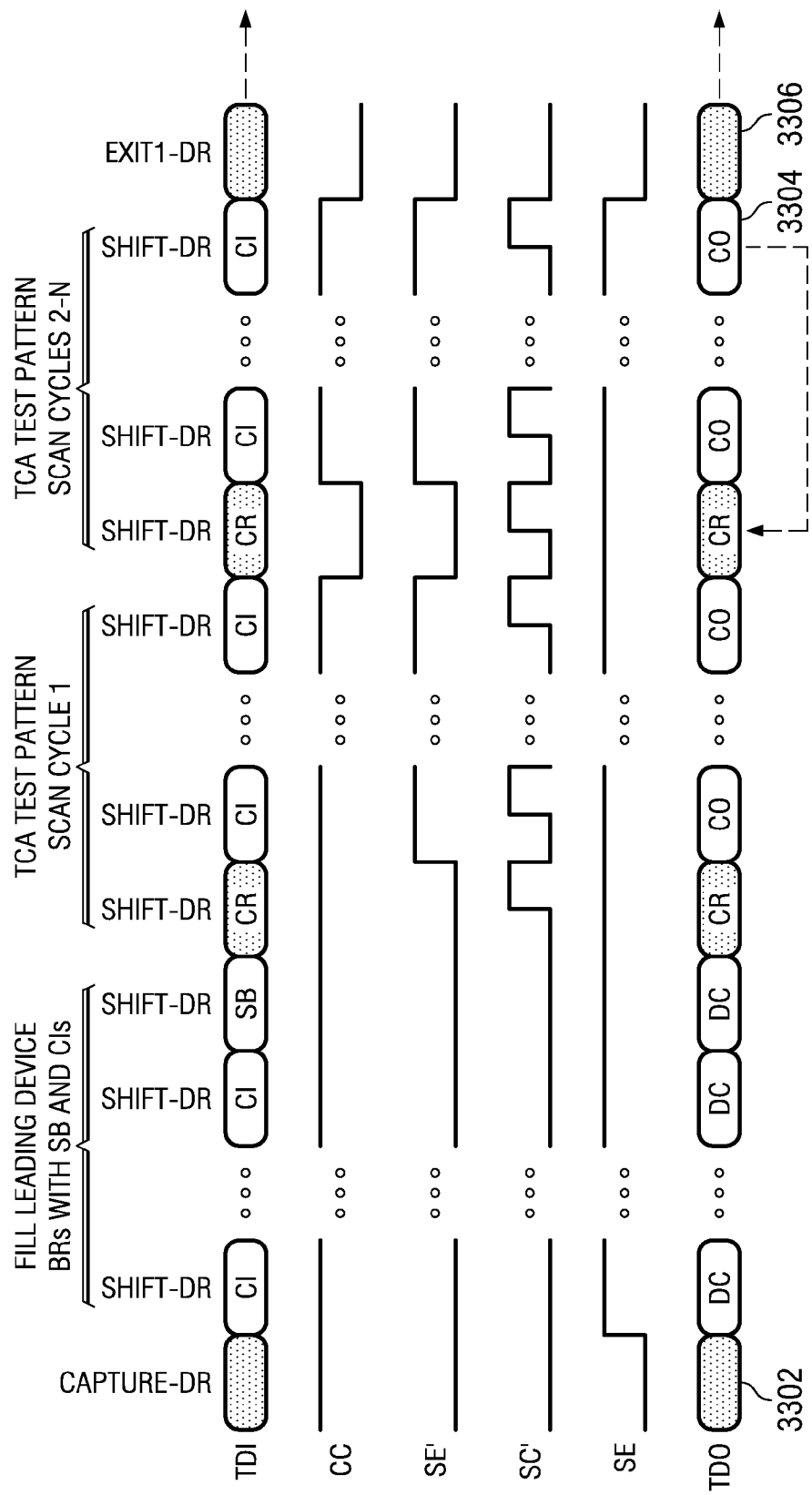
FIG. 33 illustrates timing to apply TCA scan cycles to the device of FIG. 32 according to the disclosure.

FIG. 33 illustrates the timing diagram of how the device manufacturer's TCA test patterns may be reapplied to device 2302 when device 2302 exists in the daisy-chain arrangement 3200 of FIG. 32. As can be seen in comparing the timing diagram of FIG. 33 with the one in FIG. 31, the device manufacturer TCA test patterns are applied using SBD controlled scan cycles that are identical in operation to the scan cycles described in FIG. 31 from timing point 3302 to timing point 3304. As mentioned in regard to the timing diagram of FIG. 31, SBD 2304 of device 2302 will advantageously not start the TCA test until all the logic low BBs have been shifted out of the leading devices 3002-3004 BRs and the logic high SB has been input to the SBD 2304 of device 2302. The only difference between the timing diagrams of FIGS. 33 and 31 is that since the daisy-chain arrangement 3200 does not include any trailing devices, the last scan cycle at the end of the SBD controlled TCA test of FIG. 31 is not required and the test ends by simply transitioning from the Shift-DR state to the Exit1-DR state 2206 as previously shown and described in regard to the timing diagram of FIG. 26.

As can be seen and appreciated the same device TCA test pattern set used by the device 2302 manufacturer can be reapplied in a customer's daisy-chain arrangement 3200 simply by performing a first scan cycle to load the SB and CI data into the leading device's BRs. Again, the reason the manufacturer's TCA test pattern set can be reapplied comes from the fact that the new SBD TCA test instruction of the present disclosure avoids using the Capture-DR state to capture response into the TCA's scan paths and reset the TCA's decompressor. By not using the Capture-DR state during TCA scan cycles, the BRs of leading devices are never set to a logic zero during the TCA test, which allows the BRs to operate as leading pipeline bits between the JTAG controller 606 and device 1302. Since the leading device BRs operate as pipeline bits, the time to apply the TCA test patterns is the same as the direct manufacturing TCA test arrangement of FIG. 23 with the exception of the time it takes to do the first scan cycle to fill the leading devices BRs with CI data.

Third TCA Design Approach Description

Figure 34:
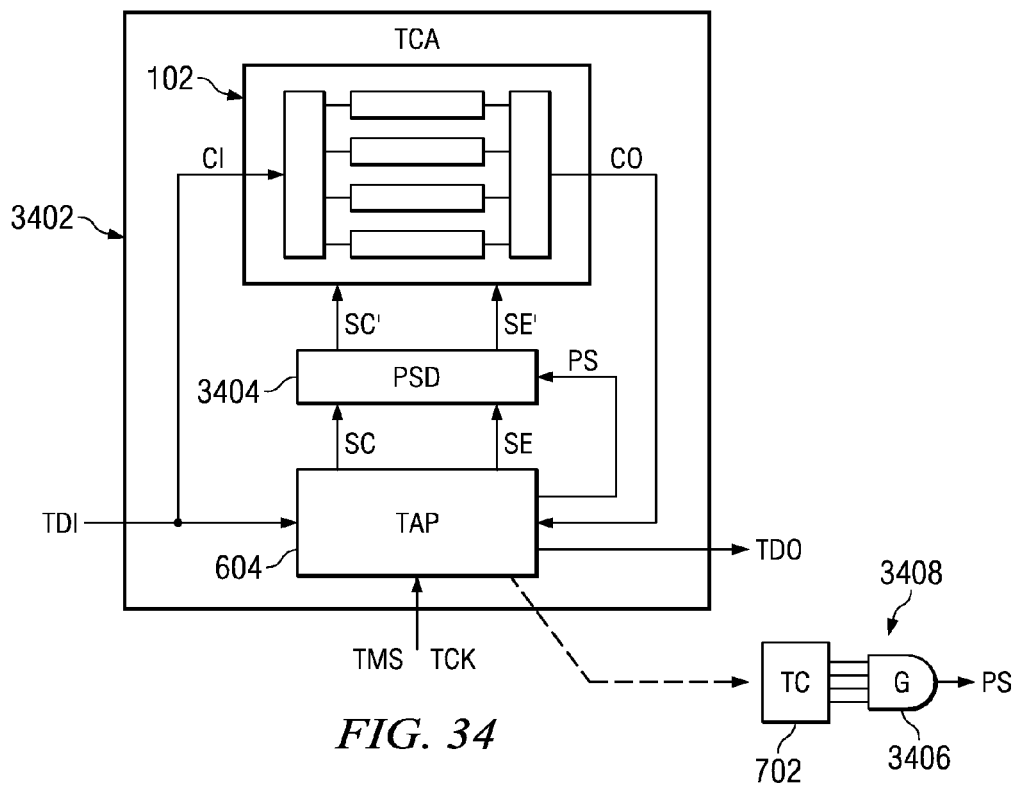
FIG. 34 illustrates a device comprising a TCA, a Pause State Detector (PSD) circuit, and a TAP to improve TCA testing according to the disclosure.

FIG. 34 illustrates a device 3402 comprising a TCA 102, a TAP 604, and a Pause-DR State detector (PSD) circuit 3404 connected as shown. The PSD circuit 3404 is a circuit placed in the device to start a TCA test whenever the TAP controller 702 of TAP 604 transitions to the Pause-DR state. The PSD circuit 3404 inputs a Pause-DR State (PS) signal from the TAP controller 702 of TAP 604 and the SC and SE signals from TAP 604. The PS signal can be produced by connecting a gate 3406 to the Tap controller's 702 state bus to detect when the TAP controller is in the Pause-DR state, as seen in arrangement 3408. The PSD circuit outputs an SC' signal and an SE' signal to the TCA 102. When a PSD TCA test instruction is loaded into the IR 704 of TAP 604 the PSD circuit begins polling the PS input for a signal which indicates the TAP controller 702 is in the Pause-DR state. When the PSD detects the PS signal it enables the SC and SE signals from TAP 604 to be input to the TCA via the SC' and SE' signals to start the TCA test. The arrangement of FIG. 34 illustrates a direct way the device manufacturer would apply TCA test patterns to the TCA of device 3402 from a JTAG controller 606.

Figure 35:
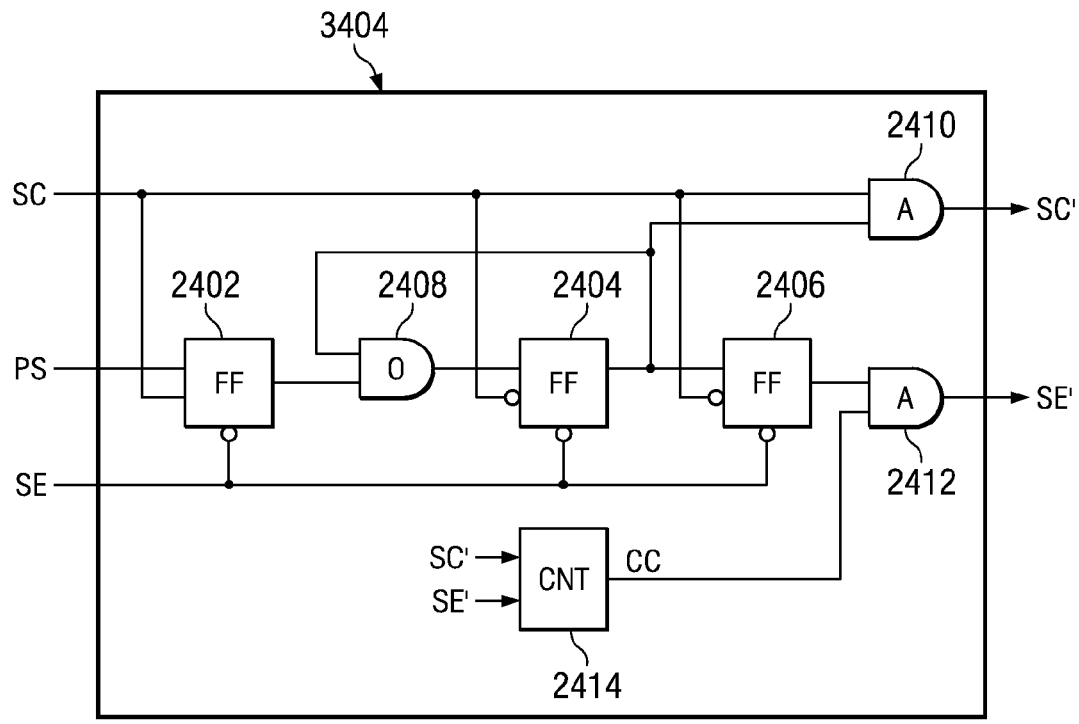
FIG. 35 illustrates the PSD circuit of FIG. 34 in more detail according to the disclosure.

FIG. 35 illustrates one example implementation of the PSD circuit 3404. The PSD circuit 3404 is identical in structure and operation to the SBD circuit 2304 described previously in regard to FIG. 24, with the exception that it inputs the PS signal in place of the TDI signal.

To start a TCA test using the PSD 3404 a PSD TCA test instruction is loaded into the IR 704 of TAP 604 and the TAP controller 702 of TAP 604 is transitioned through the Capture-DR state, Exit1-DR state, Pause-DR state, Exit2-DR state and into the Shift-DR state of FIG. 8. When the TAP controller transitions through the Pause-DR state the PS signal from Gate 3406 is asserted and detected by the PSD circuit 3404. Detection of the PS signal enables the operation of the PSD circuit 3404. When the TAP controller transitions through the Exit2-DR state from the Pause-DR state the PSD circuit outputs an SC clock on the SC' input to the TCA which causes the TCA to capture response data into the scan paths 108 and reset the decompressor 104, since the TCA's SE' input is low. When the TAP controller transitions from the Exit2-DR state to the Shift-DR state the PSD's SE's output goes high, since SE is high, and the PSD's SC' output passes SC clocks to TCA 102 to input CI data to the TCA from TDI and output CO data from the TCA on TDO. The TAP controller 702 will remain in the Shift-DR state for the duration of the PSD controlled TCA test, as did the TAP controller 702 of the SBD controlled TCA test described in FIGS. 23-26. While the TAP controller 702 is in the Shift-DR state, the PSD's counter 2414 will output the CC signal after a predetermined number of SC' shift clocks have been to the TCA as described in regard to the SBD 2304 of FIG. 24. In response to CC going low the PSD will set the SE' signal low and perform a TCA capture and reset (CR) operation as described above. Following the TCA capture and reset operation SE's goes back high to start the next TCA shift operation. This TCA capture and reset (CR) operation followed by a TCA shift operation forms a TCA scan cycle and it repeats each time the counter outputs the CC signal. After all the scan cycles of the manufacturers test pattern set has been applied to the TCA the TAP controller transitions out of the Shift-DR state which sets SE low to reset the PSD FFs 2402-2406 and stop the PSD controlled TCA test.

Figure 36:
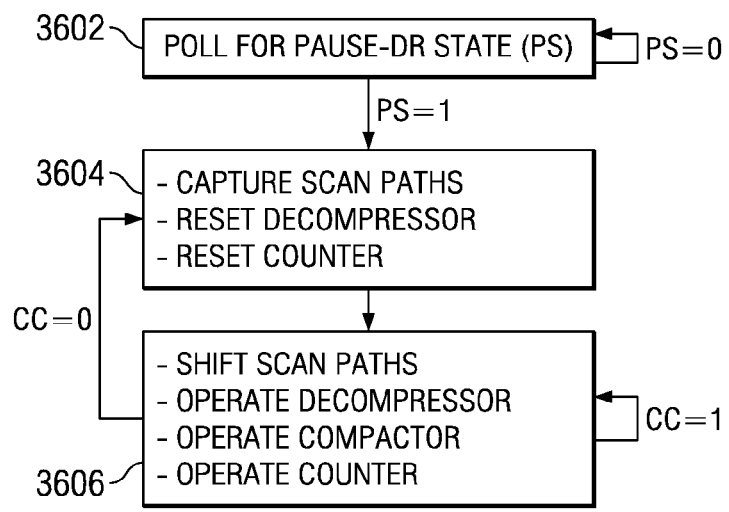
FIG. 36 illustrates the operation of the PSD circuit of FIG. 35 according to the disclosure.

FIG. 36 illustrates a state diagram depicting the operation of PSD 3404. State 3602 of the PSD operation diagram is the same as state 2502 of the SBD operation of FIG. 25 with the exception that the PSD polls for the PS signal to start the TCA test operation instead of polling for the start bit (SB) signal to start the TCA test operation as described in FIG. 25. States 3604 and 3606 of FIG. 36 perform the same operations as described in states 2504 and 2506 of FIG. 25. As seen, transitions between states 3604 and 3606 occur in response to the CC signal as described in FIG. 25. The PSD will operate in states 2504 and 2506 until the PSD controlled TCA test is complete, which is indicated by the TAP controller transitioning out of the Shift-DR state.

Figure 37:
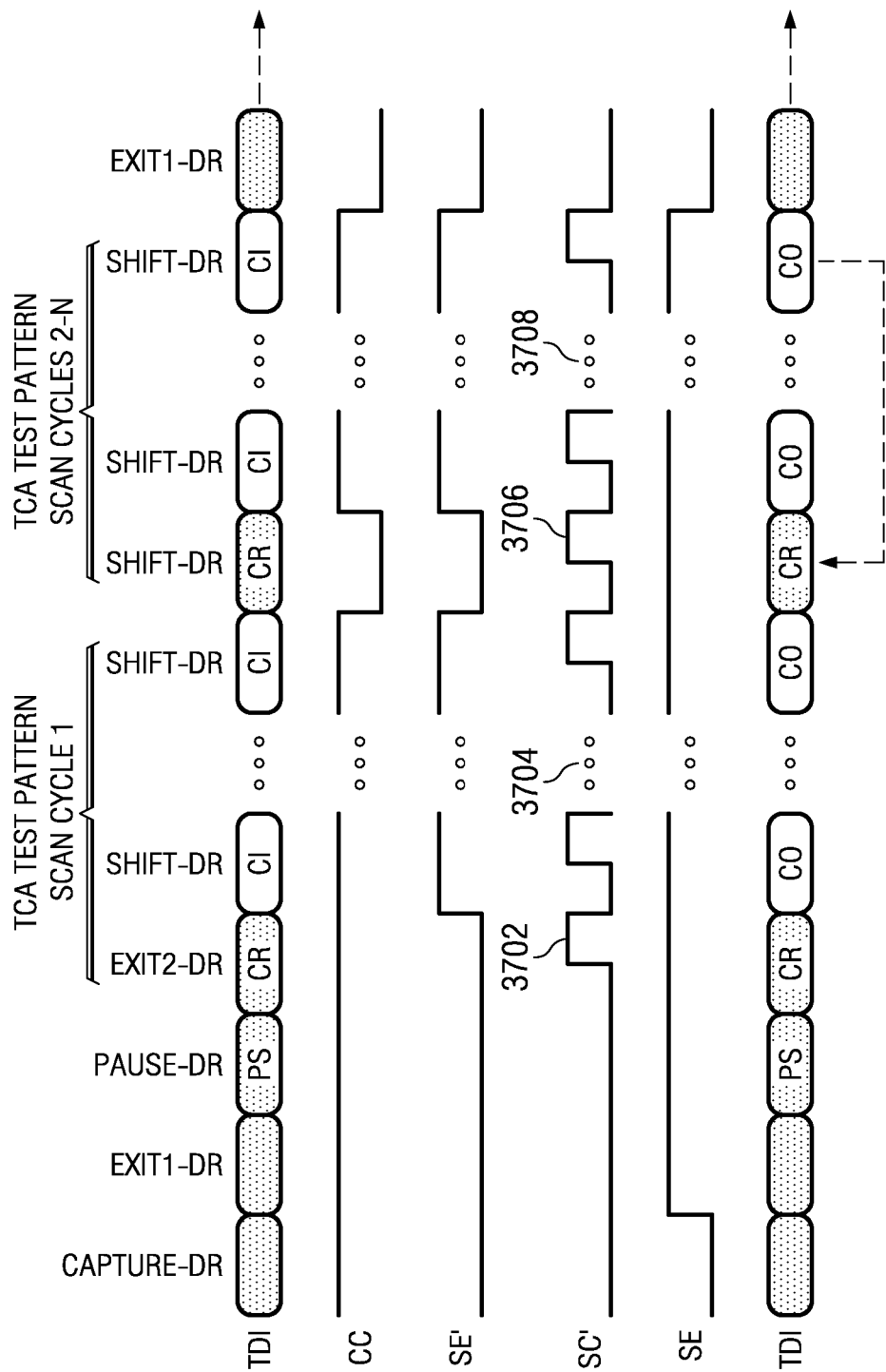
FIG. 37 illustrates timing of TCA scan cycles using the PSD circuit of FIG. 34 according to the disclosure.

FIG. 37 illustrates the timing diagram of how device manufacturers TCA test patterns can be applied using the PSD TCA test instruction of the present disclosure. As seen the TCA test starts by transitioning the TAP controller 702 into the Capture-DR state of FIG. 8 which enables SC clock outputs from TAP 604. Next the TAP controller 702 transitions to Pause-DR state via the Exit1-DR state to assert the PS signal which enables the operation of PSD circuit 3404. Next the TAP controller 702 transitions to the Exit2-DR state and the enabled PSD circuit 3404 starts a first TCA scan cycle by outputting an SC' clock 3702 while SE' is low to capture response data into scan paths 108 and reset decompressor 104. Next the TAP controller 702 transitions to the Shift-DR state and the PSD starts a TCA scan cycle shift operation by outputting additional SC's clocks 3704 to input CI data to TCA from TDI and output CO from TCA on TDO. When the counter's CC output goes low the PSD starts the next TCA scan cycle by performing a capture/reset (CR) operation with SC' clock 3706 and shift operations with SC' clocks 3708. The PSD repeats 3710 the TCA capture/reset (CR) clock 3706 and shift clocks 3708 in response to a low on CC for each remaining TCA scan cycle in the TCA test pattern set. When the TCA test is complete the TAP controller 702 transitions from the Shift-DR state to disable the PSD.

As can be seen from the above description of FIGS. 34-37, the TAP controller 702 only enters the Capture-DR state once at the beginning of the PSC controlled TCA test. The TAP controller 702 remains in the Shift-DR state for the duration of the PSD controlled TCA test. The benefit of applying device manufacturing TCA test patterns using PSD controlled TCA scan cycles while the TAP controller remains in the Shift-DR state will be appreciated in the following JTAG daisy-chain arrangement descriptions of FIG. 38-42.

Figure 38:
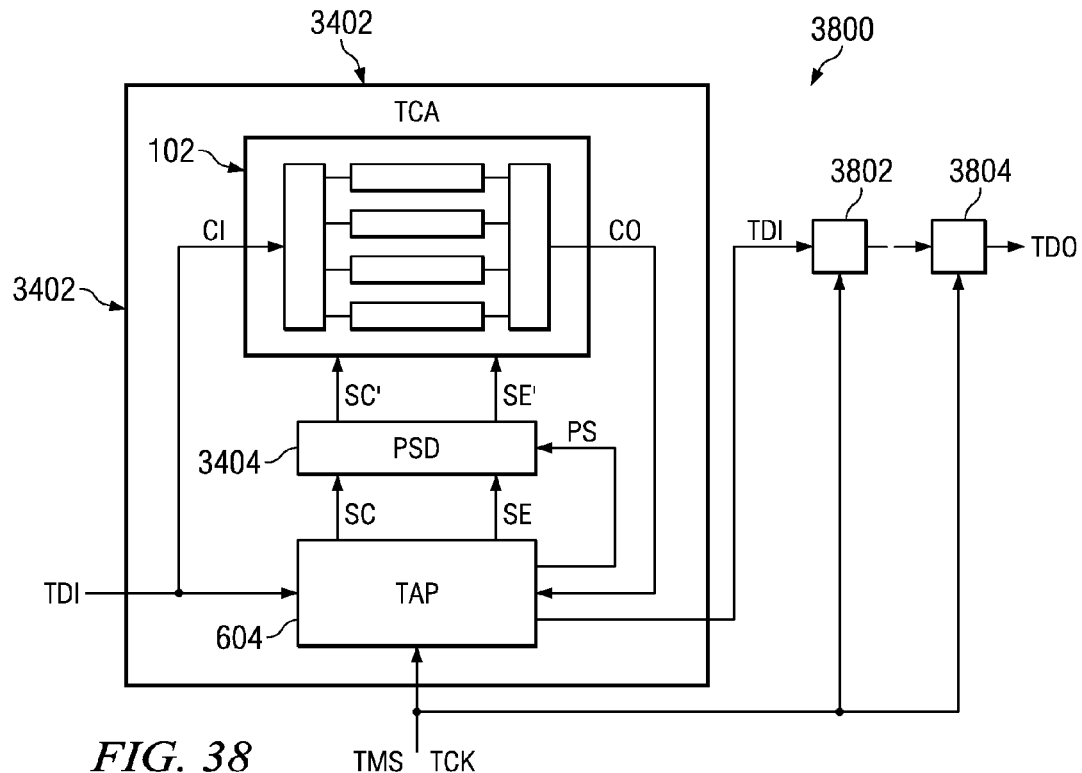
FIG. 38 illustrates the device of FIG. 34 in a daisy-chain arrangement with trailing devices.

FIG. 38 illustrates device 3402 of FIG. 34 being placed in JTAG daisy-chain arrangement 3800 with a number of trailing devices 3802-3804. The daisy-chain arrangement of FIG. 38 could be a customer's system that uses device 3402. The daisy-chain arrangement 3800 of FIG. 38 is similar to daisy-chain arrangement 1008 of FIG. 12A. When a PSD controlled TCA test is to be performed on device 3402, the IR 704 of device 3402 is loaded with the PSD TCA test instruction described in FIGS. 34-37 and the IRs of devices 3802-3804 are loaded with instructions that select their BRs.

Figure 39:
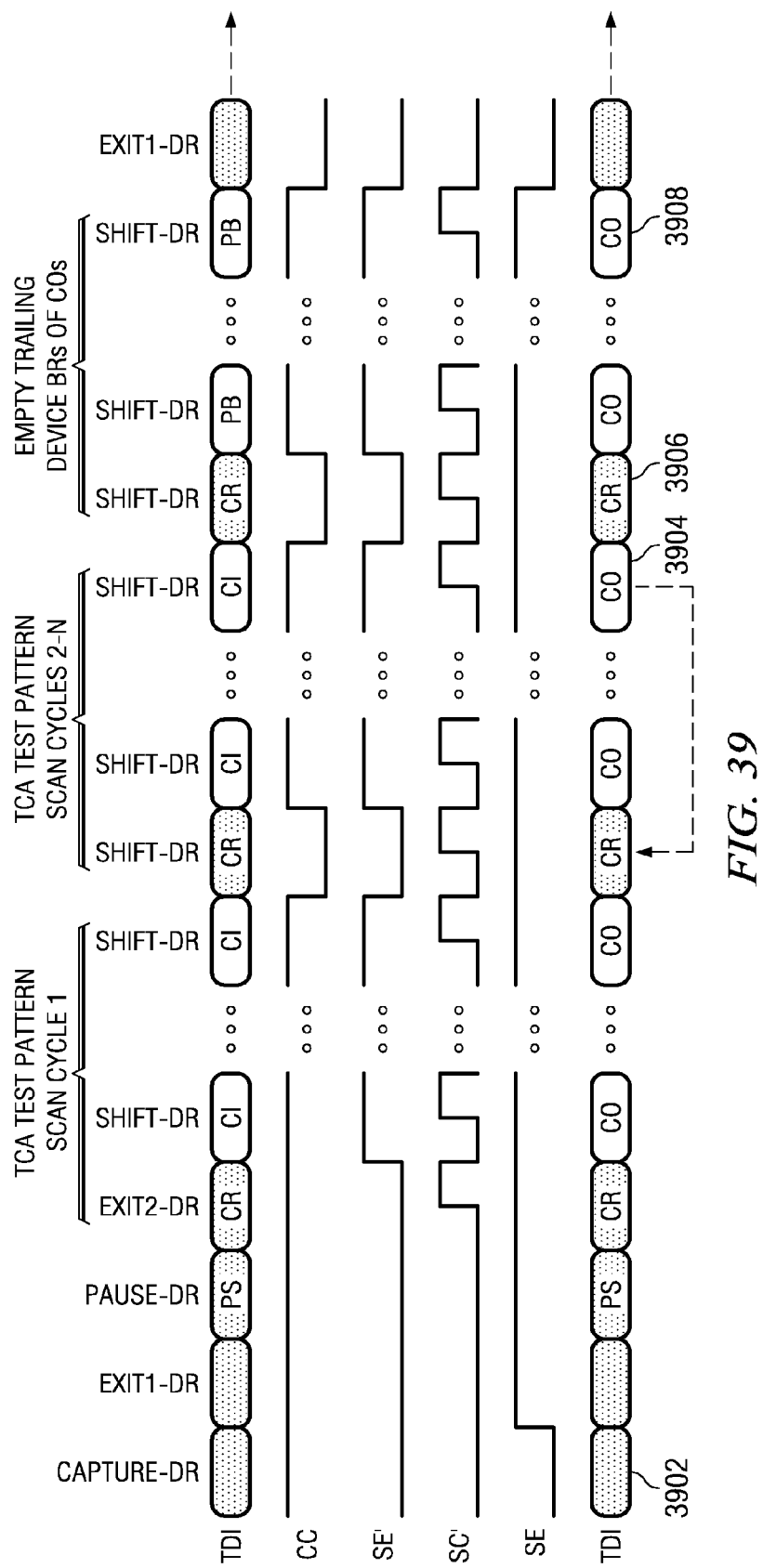
FIG. 39 illustrates timing to apply TCA scan cycles to the device of FIG. 38 according to the disclosure.

FIG. 39 illustrates the timing diagram of how the device manufacturer's TCA test patterns may be reapplied to device 3402 when device 3402 exists in the daisy-chain arrangement 3800 of FIG. 38. As can be seen in comparing the timing diagram of FIG. 39 with the one in FIG. 37, the device manufacturer TCA test patterns are applied using PSD controlled scan cycles that are identical in operation to the PSD controlled scan cycles described in FIG. 37 from timing point 3902 to timing point 3904. The only difference between the timing diagrams of FIGS. 37 and 39 is that at the end of test when all manufacturer TCA test patterns have been applied to device 3402, the timing diagram of FIG. 39 performs one last scan cycle at timing points 3906 to 3908 to allow the CO data that has been shifted into the BRs of the trailing devices 3802-3804 to be shifted out to the JTAG controller 606. Following this last shift operation to unload CO data from the BRs the SBD TCA test completes by transitioning from the Shift-DR state to the Exit1-DR state.

As can be seen and appreciated the same device TCA test pattern set used by the device 3402 manufacturer can be reapplied in a customer's daisy-chain arrangement 3800 simply by performing a last scan cycle to unload CO data from the trailing device BRs. The reason the manufacturer's TCA test pattern set can be reapplied comes from the fact that the new PSD TCA test instruction of the present disclosure avoids using the Capture-DR state to capture response into the TCA's scan paths and reset the TCA's decompressor. By not using the Capture-DR state during PSD controlled TCA scan cycles, the BRs of the trailing devices are never set to a logic zero during the TCA test, which allows the BRs to operate as pipeline bits between the TDO output of device 3402 and the TDO input to the JTAG controller 606. Since the trailing device BRs operate as pipeline bits, the time to apply the TCA test patterns is the same as the direct manufacturing TCA test arrangement of FIG. 34 with the exception of the time it takes to do the last scan cycle to empty the BR pipeline bits of CO data. During the last scan cycle of FIG. 39 appropriate pad bits (PB) are applied to the TDI input of device 1302 from the JTAG controller.

Figure 40:
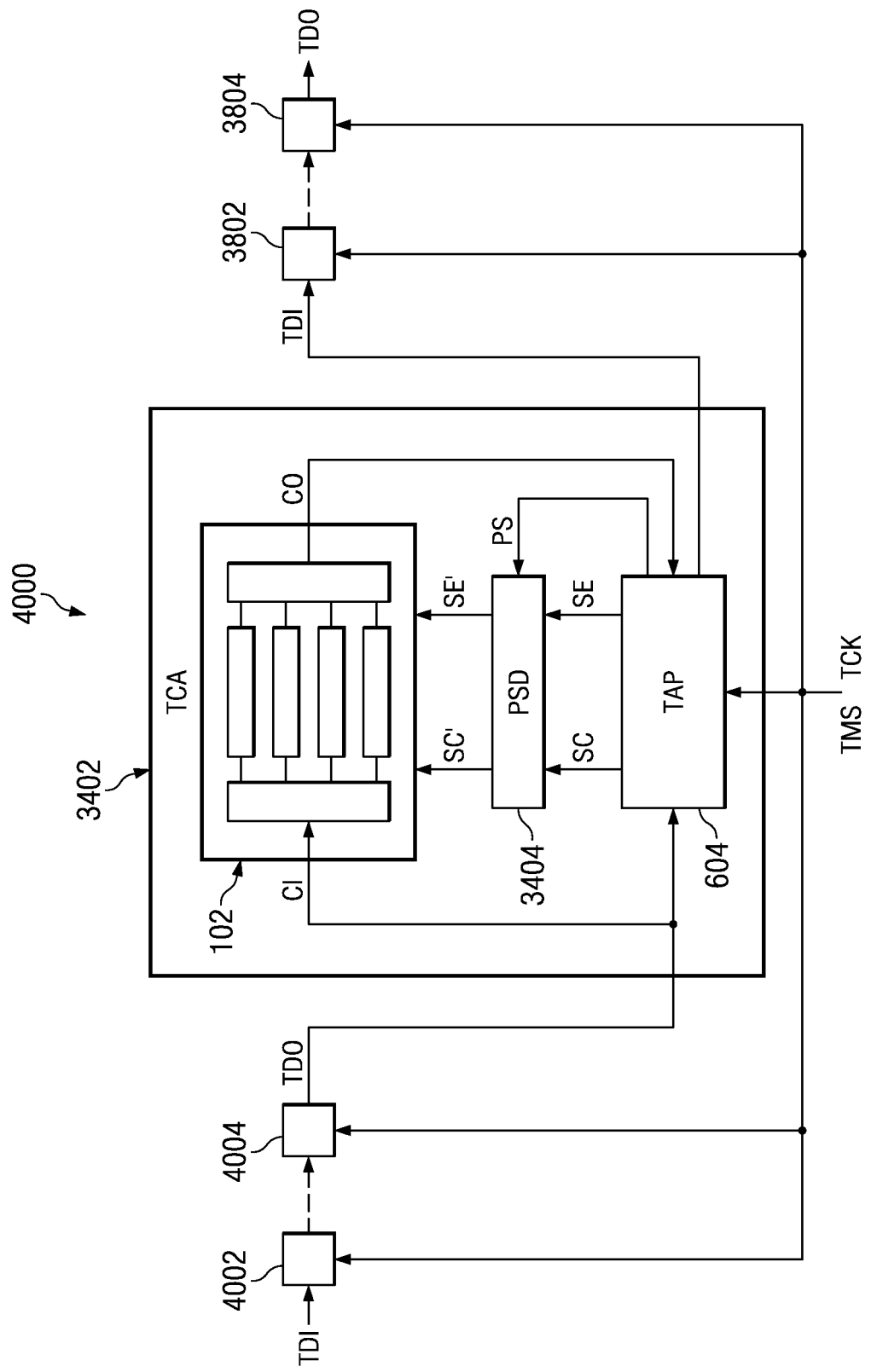
FIG. 40 illustrates the device of FIG. 34 in a daisy-chain arrangement with leading and trailing devices.

FIG. 40 illustrates device 3402 of FIG. 34 being placed in JTAG daisy-chain arrangement 4000 with a number of leading devices 4002-4004 and trailing devices 3802-3804. The daisy-chain arrangement of FIG. 40 could be a customer's system that uses device 3402. The daisy-chain arrangement 4000 of FIG. 40 is similar to daisy-chain arrangement 1008 of FIG. 12B. When a PSD controlled TCA test is to be performed on device 3402, the IR 704 of device 3402 is loaded with the new PSD TCA test instruction described in FIGS. 34-37 and IRs of devices 4002-4004 and 3802-3804 are loaded with instructions that select their BRs.

Figure 41:
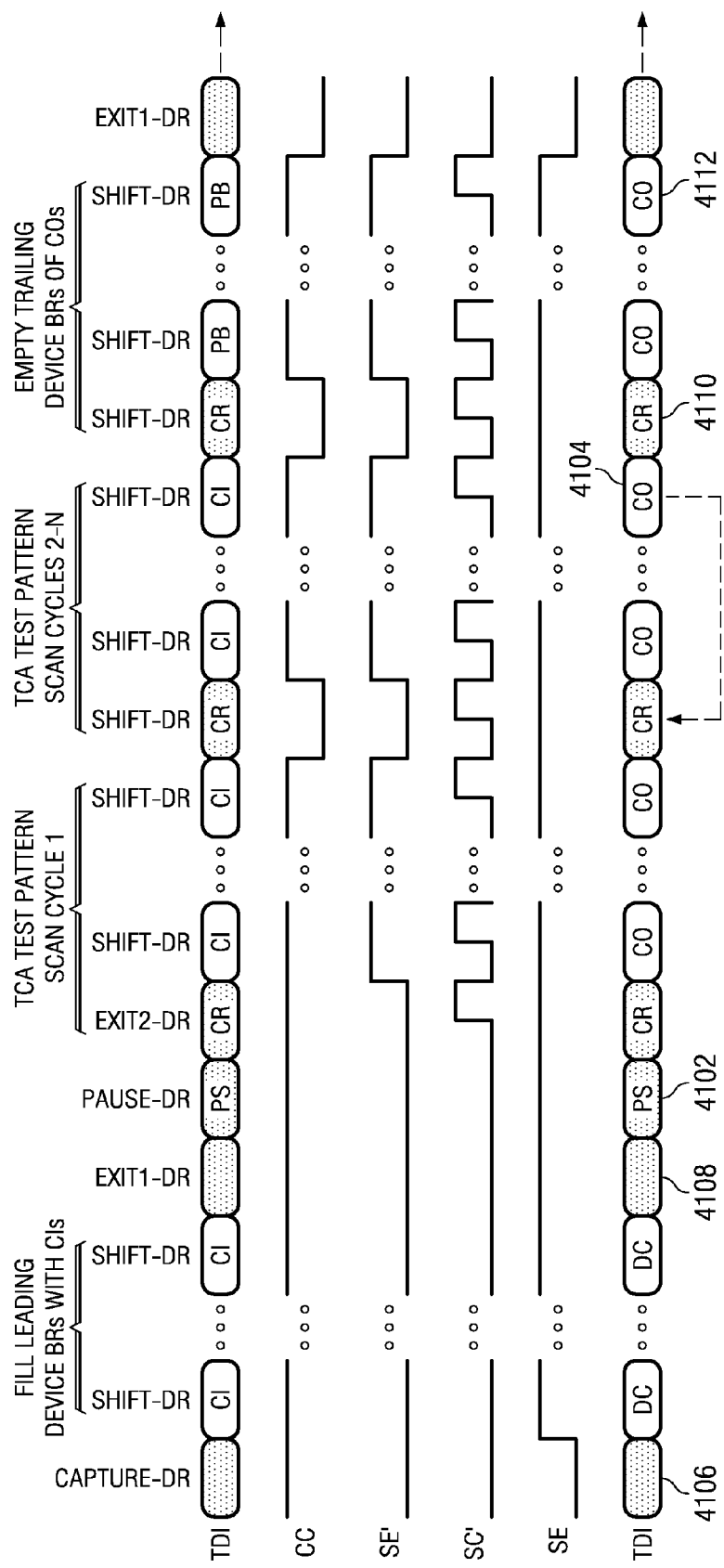
FIG. 41 illustrates timing to apply TCA scan cycles to the device of FIG. 40 according to the disclosure.

FIG. 41 illustrates the timing diagram of how the device manufacturer's TCA test patterns may be reapplied to device 3402 when device 3402 exists in the daisy-chain arrangement 4000 of FIG. 40. As can be seen in comparing the timing diagram of FIG. 41 with the one in FIG. 39, the device manufacturer TCA test patterns are applied using PSD controlled scan cycles that are identical in operation to the scan cycles described in FIG. 39 from timing point 4102 to timing point 4104, followed by a last scan cycle from timing point 4110 to timing point 4112 to unload CO data from the trailing device BRs. The only difference between the timing diagrams of FIGS. 41 and 39 is that at the beginning of the PSD controlled TCA test a first scan cycle is performed between timing points 4106 and 4108 to allow the CI data from the JTAG controller to be shifted into the BRs of the leading devices 4002-4004. It is important to note that the PSD 3404 of device 3402 will not start the TCA test until all the logic low BBs have been shifted out of the leading devices 4002-4004 BRs and the CI data has been input to devices 4002-4004. Following this first scan cycle operation to load CI data into the leading BRs, the PSD controlled TCA test is started by the TAP controller 702 transitioning through the Pause-DR state and executes until completion as described in the timing diagram of FIG. 39. As can be seen and understood the PSD controlled TCA test operation is delayed from starting by the number of shift operations required to pass the CI data into the BRs of leading devices 4002-4004. By delaying the start of the TCA test operation, the TCA's decompressor 104 does not advance from its starting seed state as described in regard to the arrangements 108 of FIGS. 12B-12C.

As can be seen and appreciated the same device TCA test pattern set used by the device 3402 manufacturer can be reapplied in a customer's daisy-chain arrangement 4000 simply by performing a first scan cycle to load the CI data into leading device BRs and a last scan cycle to unload CO data from trailing device BRs. Again, the reason the manufacturer's TCA test pattern set can be reapplied comes from the fact that the new PSD TCA test instruction of the present disclosure avoids using the Capture-DR state to capture response into the TCA's scan paths and reset the TCA's decompressor. By not using the Capture-DR state during PSD controlled TCA scan cycles, the BRs of leading and trailing devices are never set to a logic zero during the TCA test, which allows the BRs to operate as leading and trailing pipeline bits between the JTAG controller 606 and device 3402. Since the leading and trailing device BRs operate as pipeline bits, the time to apply the TCA test patterns is the same as the direct manufacturing TCA test arrangement of FIG. 23 with the exception of the time it takes to do the first and last scan cycles to fill leading devices with CI data and empty trailing devices of CO data. During the first scan cycle of FIG. 41 the data output to the JTAG controller's TDO input are considered don't care bits (DC).

Figure 42:
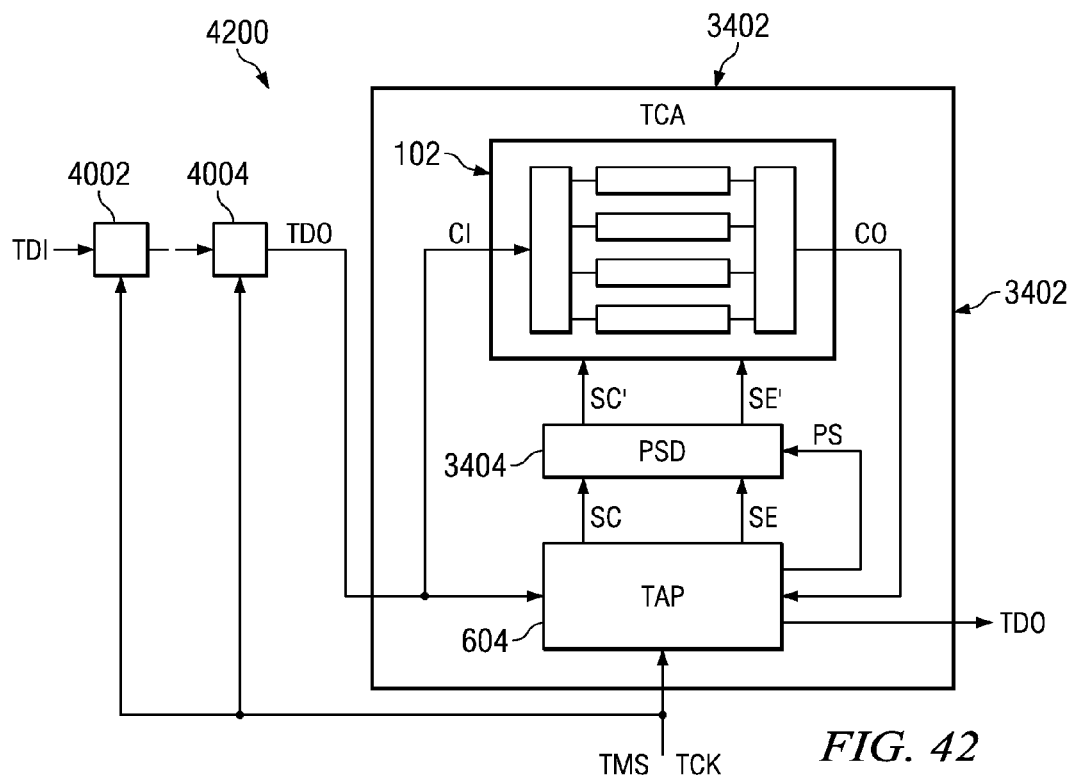
FIG. 42 illustrates the device of FIG. 34 in a daisy-chain arrangement with leading devices.

FIG. 42 illustrates device 3402 of FIG. 34 being placed in JTAG daisy-chain arrangement 4200 with a number of leading devices 4002-4004. The daisy-chain arrangement of FIG. 42 could be a customer's system that uses device 3402. The daisy-chain arrangement 4200 of FIG. 42 is similar to daisy-chain arrangement 1008 of FIG. 12C. When a PSD controlled TCA test is to be performed on device 3402, the IR 704 of device 3402 is loaded with the new PSD TCA test instruction described in FIGS. 23-26 and IRs of devices 4002-4004 are loaded with instructions that select their BRs.

Figure 43:
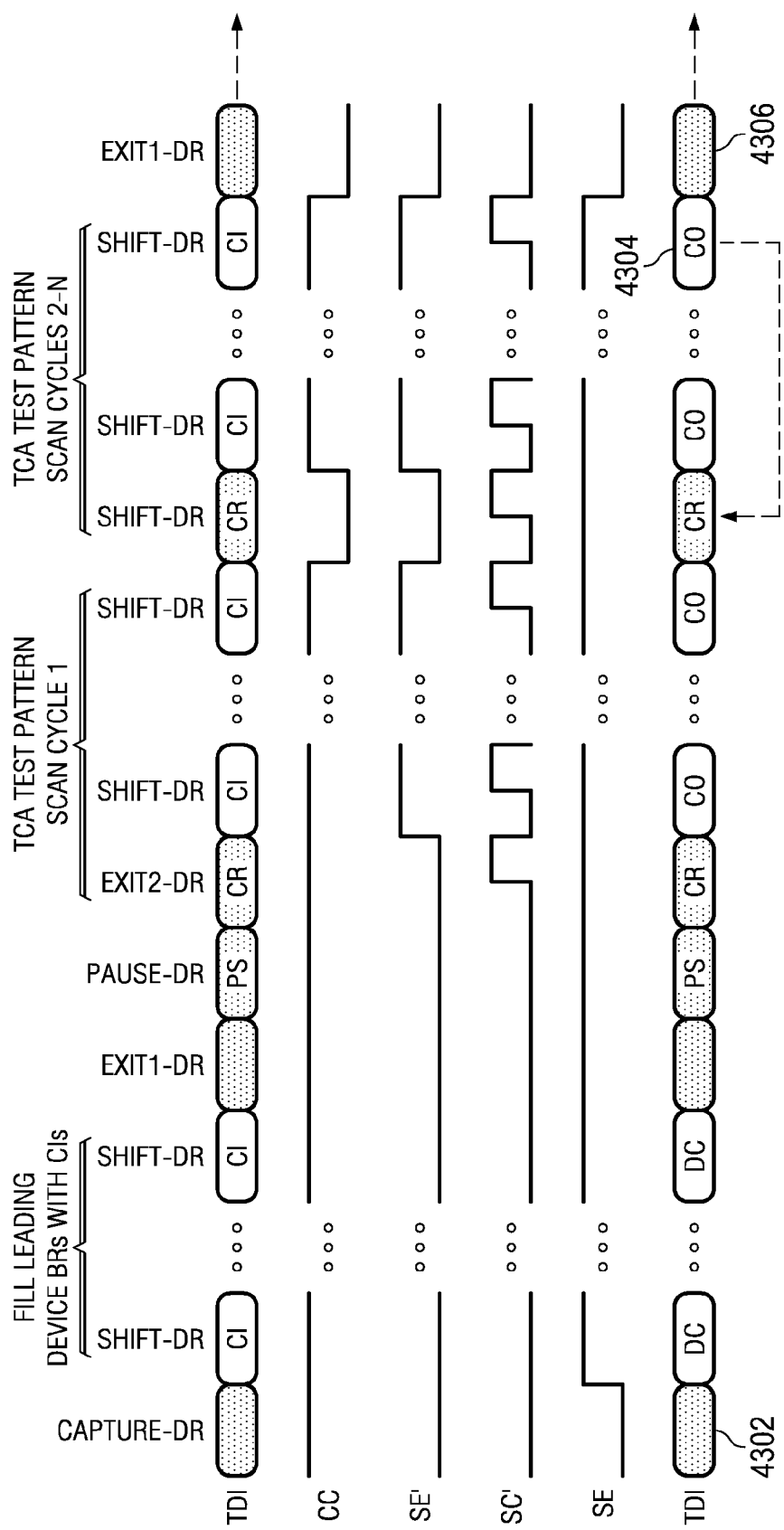
FIG. 43 illustrates timing to apply TCA scan cycles to the device of FIG. 42 according to the disclosure.

FIG. 43 illustrates the timing diagram of how the device manufacturer's TCA test patterns may be reapplied to device 3402 when device 3402 exists in the daisy-chain arrangement 4200 of FIG. 42. As can be seen in comparing the timing diagram of FIG. 43 with the one in FIG. 41, the device manufacturer TCA test patterns are applied using PSD controlled scan cycles that are identical in operation to the scan cycles described in FIG. 41 from timing point 4302 to timing point 4304. As mentioned in regard to the timing diagram of FIG. 41, PSD 3404 of device 3402 will advantageously not start the TCA test until all the logic low BBs have been shifted out of the leading devices 4002-4004 BRs and the CI data from the JTAG controller 606 has been input leading device BRs. The only difference between the timing diagrams of FIGS. 43 and 41 is that since the daisy-chain arrangement 4200 does not include any trailing devices, the last scan cycle at the end of the PSD controlled TCA test of FIG. 41 is not required and the test ends by simply transitioning from the Shift-DR state to the Exit1-DR state 4306 as previously shown and described in regard to the timing diagram of FIG. 26.

As can be seen and appreciated the same device TCA test pattern set used by the device 3402 manufacturer can be reapplied in a customer's daisy-chain arrangement 4200 simply by performing a first scan cycle to load the CI data into the leading device's BRs. Again, the reason the manufacturer's TCA test pattern set can be reapplied comes from the fact that the new PSD TCA test instruction of the present disclosure avoids using the Capture-DR state to capture response into the TCA's scan paths and reset the TCA's decompressor. By not using the Capture-DR state during TCA scan cycles, the BRs of leading devices are never set to a logic zero during the TCA test, which allows the BRs to operate as leading pipeline bits between the JTAG controller 606 and device 3402. Since the leading device BRs operate as pipeline bits, the time to apply the TCA test patterns is the same as the direct manufacturing TCA test arrangement of FIG. 23 with the exception of the time it takes to do the first scan cycle to fill the leading devices BRs with CI data.

Figure 44:
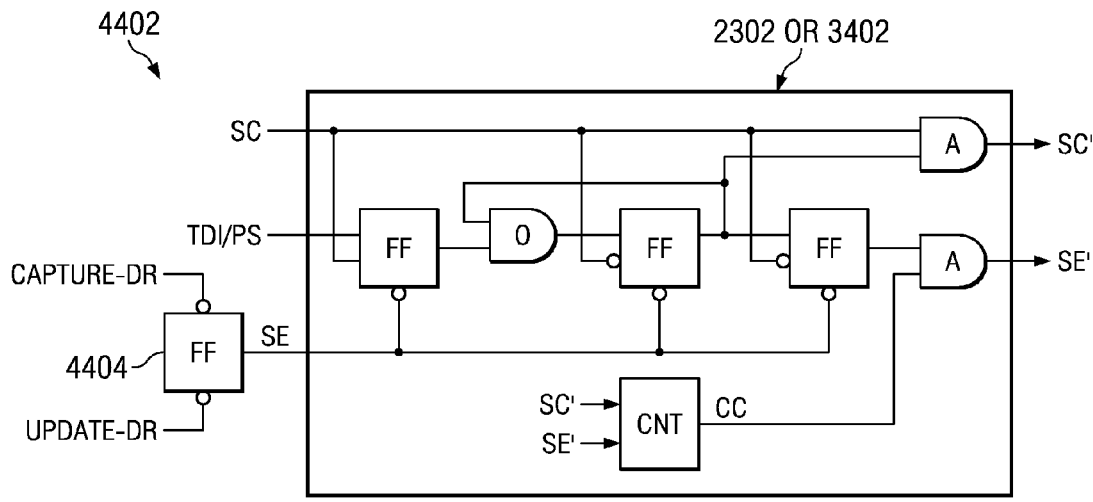
FIG. 44 illustrates an alternate implementation of the SBD and PSD circuits according to the disclosure.

FIG. 44 illustrates an alternate example implementation of the SBD 2302 and PSD 3402 circuits described in regard to FIGS. 23-33 and 34-43 respectively. In some instances it may be desired to utilize the TAP controller Pause-DR state of FIG. 8 during an SBD or PSD controlled TCA test. For example, the Pause-DR state would allow a low cost tester that cannot sustain a continuous CI input to the TCA and/or a CO output from a TCA to be used for TCA testing in place of a high cost tester. When the low cost tester needs to suspend CI input and CO output operations it simply transitions the device TAP controller 702 to the Pause-DR state until it is ready to resume the CI input and CO output operations. The example SBD 2304 and PSD 3404 circuits 2304 and 3404 of FIGS. 23-33 and 34-43 cannot use the Pause-DR state since they are reset and disabled whenever the TAP controller 702 exits the Shift-DR state and sets SE low.

The alternate SBD or PSD implementation of FIG. 44 comprises the SBD circuit 2302 or PSD circuit 3402 and a set/reset FF 4404. The output of the FF 4404 is connected to the SE input of the SBD/PSD circuit in place of the SE output from TAP 604. All other inputs and output of the SBD/PSD circuit are connected to the TAP 604 and TCA 102 as previously describe. The set input of FF 4404 is connected to a signal indicating the TAP controller 702 is in the Capture-DR state. The reset input of FF 4404 is connected to signal indicating the TAP controller 702 is in the Update-DR state. The Capture-DR and Update signals may be produced by decoding the TAP controller 702 state bus as shown previously in regard to circuit arrangement 3408 of FIG. 34 or by any other means. As can be seen the SE input of the SBD/PSD circuit is set high by FF 4404 when the TAP controller 702 transitions to the Capture-DR state at the beginning of a TCA tests and remains high until FF 4404 is reset when the TAP controller 702 transitions to the Update-DR state at the end of the TCA test. While the SE signal is high the SBD/PSD circuit can be operated while the TAP controller 702 is in the Shift-DR state as described in FIGS. 23-33 and 34-43. Also, since the SE signal is controlled by FF 4404 instead of the SE output of TAP 604, the TAP controller 702 can transition from the Shift-DR state to the Pause-DR state via the Exit1-DR state to pause a CI input and CO output shift operation, then transition back into the Shift-DR state from the Pause-DR state via the Exit2-DR state and resume the CI input and CO output shift operation. This pausing of the CI input and CO output shift operations is not possible using the example SBD 2302 and PSD 3402 circuits since those circuits are reset by SE whenever the TAP controller 702 transitioned from the Shift-DR state. While FIG. 44 shows one example of how to implement an SBD/PSD circuit 4402 capable of using the TAP controller's Pause-DR state to pause and resume CI input and CO output shift operations, the disclosure is not limited to this circuit example.

Figure 45A:
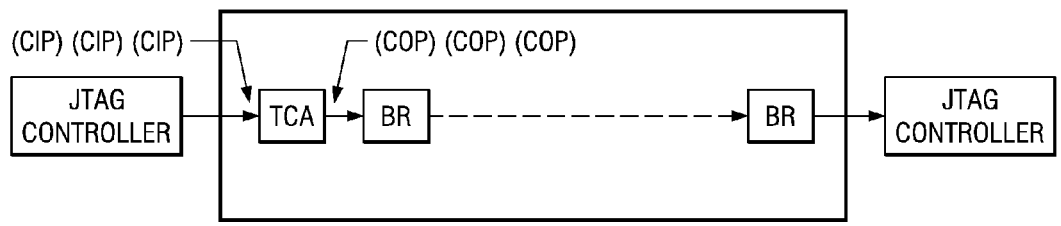
FIG. 45A illustrates a JTAG controller applying TCA test patterns, according to one of the approaches described in this disclosure, to a device in a daisy-chain with trailing devices.
Figure 45B:
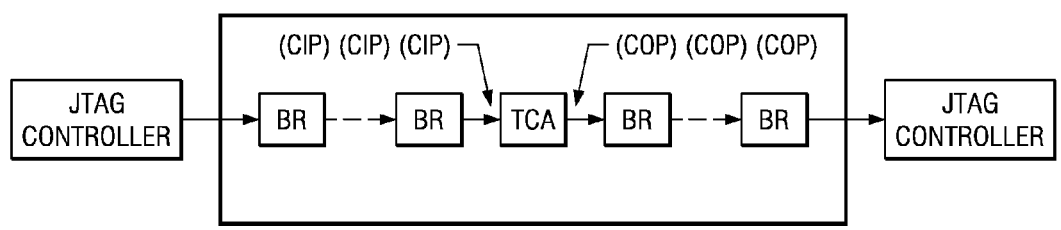
FIG. 45B illustrates a JTAG controller applying TCA test patterns, according to one of the approaches described in this disclosure, to a device in a daisy-chain with leading and trailing devices.
Figure 45C:
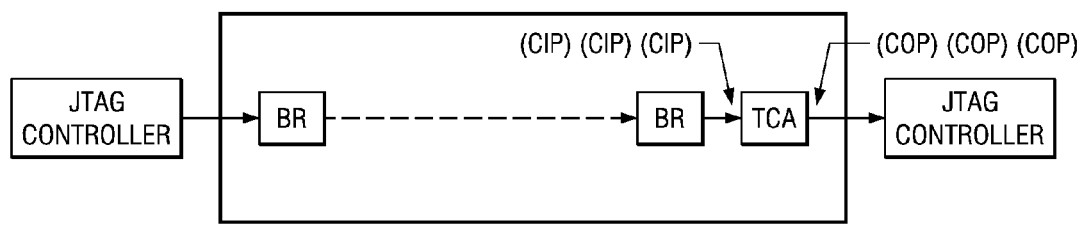
FIG. 45C illustrates a JTAG controller applying TCA test patterns, according to one of the approaches described in this disclosure, to a device in a daisy-chain with leading devices.

FIGS. 45A-45C illustrate the advantages of using the three approaches described in FIGS. 13-21 (modified TAP approach), FIGS. 23-33 (SBD approach) and FIG. 34-43 (PSD approach) to apply a TCA test to a device placed in a JTAG daisy-chain scan path. In FIG. 45A the device manufacturer's TCA test pattern set is shown being applied to a device in a JTAG daisy-chain that includes trailing devices. In FIG. 45B the device manufacturer's TCA test pattern set is shown being applied to a device in a JTAG daisy-chain that includes leading and trailing devices. In FIG. 45C the device manufacturer's TCA test pattern set is shown being applied to a device in a JTAG daisy-chain that includes leading devices. As can be seen, once the TCA test is stated the compressed input patterns (CIP) and compressed output patterns (COP) of the TCA test pattern set are applied directly to the TDI input and TDO output of the device being tested via the leading and/or trailing bypass register (BR) of the other devices. This key advantage is brought about by the fact the three described approaches allow the BRs of neighboring devices to operate as pipeline bits between the JTAG controller and device being tested. The BRs are allowed to operate as pipeline bits because the approaches described do not require the device TAP controllers 702 to cycle through the Capture-DR state during each TCA scan cycle, as does the JTAG TCA test approach described in FIGS. 6-9. Also the test time of applying the manufacturers TCA test patterns is only extended by the length of time it takes to fill leading BRs with CI data and/or empty trailing BRs of CO data.

Figure 46:
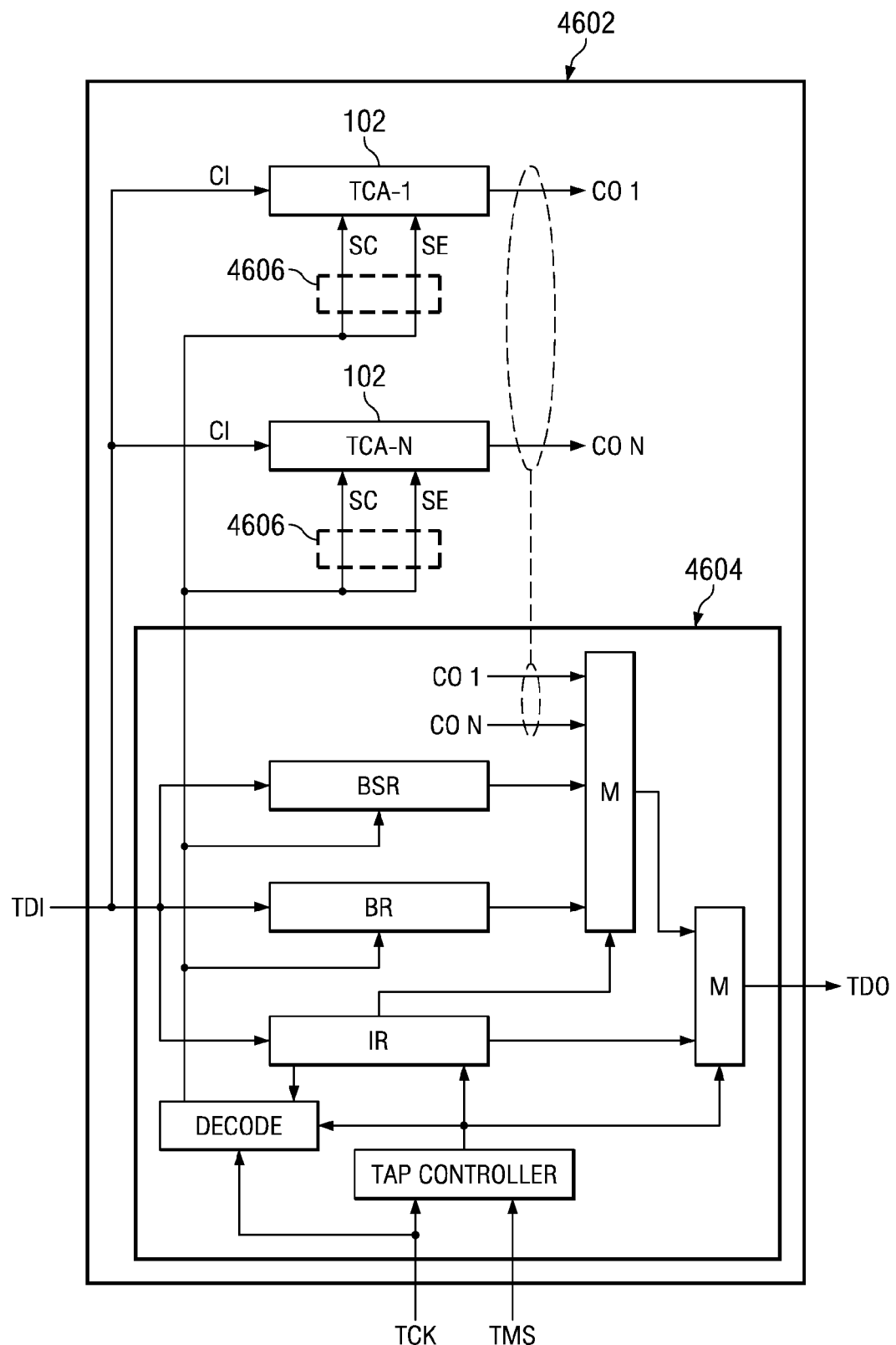
FIG. 46 illustrates a device with multiple TCA circuits that can be selected and tested using one or more of the approaches described in this disclosure.

FIG. 46 is provided to illustrate that a device 4602 may have more than one TCA circuit 102. Each TCA circuit is selected for testing using one or more of the approaches described in this disclosure. For example the selected TCA circuit may be tested using a modified TAP 4604 as described in regard to FIGS. 13-16, tested using a SBD circuit 2304, referenced in this example as element 4606, as described in regard to FIGS. 23-26, or tested using a PSD circuit 3404, referenced in this example as element 4606, as described in regard to FIGS. 34-37.

Although the disclosure has been described in detail, it should be understood that various changes, substitutions and alterations may be made without departing from the spirit and scope of the disclosure as defined by the appended claims.

What is claimed is:

1. An electrical device comprising:
   A. a test data in lead, a test clock lead, a test mode select lead, and a test data out lead;
   B. a test access port including a test data in input coupled to the test data in lead, a test clock input coupled to the test clock lead, a test mode select input coupled to the test mode select lead, a test data out output coupled to the test data out lead, a scan data input, a scan clock output, and a scan enable output, the test access port including:
      i. a state machine circuitry having inputs coupled to the test clock input and the test mode select input and having a Clock-DR signal output and a Pause-DR state output;
      ii. an instruction register having a serial input coupled to the test data in input and having control outputs; and
      iii. gating circuitry having inputs connected to the test clock input, the Clock-DR signal output, the Pause-DR state output, and the control outputs of the instruction register, and having outputs connected to the scan clock output and the scan enable output; and
   C. a test compression architecture circuit having a compressed data input coupled to the test data in lead, a compressed data output coupled to the scan data input of the test access port, a scan clock input coupled to the scan clock output from the test access port, and a scan enable input coupled to the scan enable output from the test access port.

2. The device of claim 1 in which the test access port includes:
   i. controller circuitry having inputs connected to the test clock input and the test mode select input and control outputs;
   ii. the instruction register has a data output coupled to the test data out output, and control inputs connected to the controller circuitry control outputs;
   iii. a data register having a data input connected to the test data in input, a data output coupled to the test data out output, and control inputs coupled to the controller circuitry control outputs; and iv. multiplexer circuitry having a control input connected to the controller circuitry control outputs, inputs coupled to the data outputs of the instruction register and the data register and to the scan data input, and an output connected to the test data out output.

3. The device of claim 1 in which the test compression architecture circuit includes:
   i. decompressor circuitry having a data input connected to the compressed data input, inputs connected to the scan clock input and the scan enable input, and serial in outputs;
   ii. plural scan paths, each scan path having a serial in input connected to a serial in output, inputs connected to the scan clock input and the scan enable input, and a serial out output; and
   iii. compactor circuitry having serial out inputs connected to the serial out outputs, inputs connected to the scan clock input and the scan enable input, and a data output connected to the compressed data output.

4. The device of claim 1 including combinational logic connected to the test compression architecture circuit.

5. The device of claim 1 in which the test access port state machine circuitry has outputs representing the following states: SELECT-DR, CAPTURE-DR, SHIFT-DR, EXIT1-DR, PAUSE-DR, EXIT2-DR, and UPDATE-DR.

\* \* \* \* \*